(12) United States Patent
Feist et al.

(10) Patent No.: US 7,087,290 B2
(45) Date of Patent: Aug. 8, 2006

(54) DATA STORAGE MEDIA UTILIZING A SUBSTRATE INCLUDING A PLASTIC RESIN LAYER, AND METHOD THEREOF

(75) Inventors: Thomas P. Feist, Clifton Park, NY (US); Wit C. Bushko, Niskayuna, NY (US); Kevin H. Dal, Clifton Park, NY (US); Daniel Furlano, Pittsfield, MA (US); Ramesh Hariharan, Guilderland, NY (US); Kazunao Kubotera, Delmar, NY (US); Bernard P. Landa, Pittsfield, MA (US); Suresh Subramanian, Fairfield, OH (US); Joseph T. Woods, Chicopee, MA (US)

(73) Assignee: General Electric, Pittsfield, MA (US)

( * ) Notice: Subject to any disclaimer, the term of this patent is extended or adjusted under 35 U.S.C. 154(b) by 420 days.

(21) Appl. No.: 09/845,743
(22) Filed: May 1, 2001
(65) Prior Publication Data

US 2002/0081460 A1 Jun. 27, 2002

Related U.S. Application Data

(62) Division of application No. 09/502,968, filed on Feb. 11, 2000, now abandoned.
(60) Provisional application No. 60/120,101, filed on Feb. 12, 1999, provisional application No. 60/134,585, filed on May 17, 1999, provisional application No. 60/137,883, filed on Jun. 7, 1999, provisional application No. 60/137,884, filed on Jun. 7, 1999, and provisional application No. 60/146,248, filed on Jul. 29, 1999.

(51) Int. Cl.
*G11B 5/73* (2006.01)
*G11B 5/82* (2006.01)

(52) U.S. Cl. ............... 428/141; 428/215; 428/336; 428/337; 428/409; 428/156; 428/694 ST; 428/694 SL; 428/694 SG; 360/135

(58) Field of Classification Search ............. 428/141, 428/156, 215, 336, 337, 409, 694 ST, 694 SL, 428/694 SG, 64.1, 64.2, 64.3, 65.3, 65.9, 428/66.5, 66.7, 170, 171, 172, 192, 304.4, 428/313.3, 402; 360/135
See application file for complete search history.

(56) References Cited

U.S. PATENT DOCUMENTS 3,198,657 A    8/1965    Kimball et al. ............. 117/101

(Continued)

FOREIGN PATENT DOCUMENTS

CA    1323697    10/1993

(Continued)

OTHER PUBLICATIONS

Quantegy article (http://www.pncengineering.com/mod-Spec.).*

(Continued)

*Primary Examiner*—Kevin M. Bernatz

(57) ABSTRACT

In one embodiment, a data storage media comprises: a substrate comprising at least one plastic portion, an edge lift height of less than about 8μ, and an axial displacement peak of less than about 500μ under shock or vibration excitation; and at least one data layer on said substrate. The data layer can be at least partly read from, written to, or a combination thereof by at least one energy field, and, when the energy field contacts the storage media, the energy field is incident upon the data layer before it could be incident upon the substrate. In another embodiment, the data storage media comprises: a substrate comprising at least one plastic portion and an axial displacement peak of less than about 500μ under shock or vibration excitation, and an areal density of about 10 Gbit/in$^2$; and at least one data layer on the substrate. The data layer can be at least partly read from, written to, or a combination thereof by at least one energy field, and, when the energy field contacts the storage media, the energy field is incident upon the data layer before it could be incident upon the substrate.

107 Claims, 15 Drawing Sheets

U.S. PATENT DOCUMENTS

| | | | |
|---|---|---|---|
| 4,020,278 A | 4/1977 | Carre et al. ................. 358/128 |
| 4,057,831 A | 11/1977 | Jacobs et al. |
| 4,206,256 A | 6/1980 | Matthies et al. |
| 4,211,617 A | 7/1980 | Hunyar et al. ................. 204/5 |
| 4,222,070 A | 9/1980 | Howe et al. |
| 4,235,835 A | 11/1980 | Stutzman et al. ........ 264/328.2 |
| 4,243,317 A | 1/1981 | Garbe et al. .................. 355/91 |
| 4,267,212 A | 5/1981 | Sakawaki ................... 427/240 |
| 4,272,474 A | 6/1981 | Crocker ................. 264/176 R |
| 4,305,081 A | 12/1981 | Spong |
| 4,329,697 A | 5/1982 | Bell |
| 4,363,844 A | 12/1982 | Lewis et al. ................... 428/65 |
| 4,373,065 A | 2/1983 | Prest, Jr. |
| 4,402,798 A | 9/1983 | Gorog et al. |
| 4,404,238 A | 9/1983 | Baldwin |
| 4,415,942 A | 11/1983 | Frosch et al. |
| 4,419,704 A | 12/1983 | Radman et al. |
| 4,430,387 A | 2/1984 | Nakagawa et al. |
| 4,441,179 A | 4/1984 | Slaten |
| 4,451,507 A | 5/1984 | Beltz et al. ................. 427/240 |
| 4,457,259 A | 7/1984 | Samuels .................... 118/705 |
| 4,492,718 A | 1/1985 | Mayer et al. |
| 4,503,420 A | 3/1985 | Rub et al. |
| 4,514,583 A | 4/1985 | Izu et al. .................... 136/259 |
| 4,515,828 A | 5/1985 | Economy |
| 4,519,065 A | 5/1985 | Lewis et al. ................. 369/275 |
| 4,552,820 A | 11/1985 | Lin et al. |
| 4,554,655 A | 11/1985 | Kumasaka et al. |
| 4,569,871 A | 2/1986 | Ohmori et al. |
| 4,584,259 A | 4/1986 | Mayer et al. |
| 4,590,493 A | 5/1986 | Inoue et al. |
| 4,592,939 A | 6/1986 | Temple et al. ................. 428/64 |
| 4,596,739 A | 6/1986 | Piltingsrud et al. |
| 4,596,740 A | 6/1986 | Tsukane |
| 4,619,804 A | 10/1986 | Leonard et al. |
| 4,622,284 A | 11/1986 | West et al. |
| 4,656,546 A | 4/1987 | Mallory |
| 4,658,392 A | 4/1987 | Langowski et al. |
| 4,659,407 A | 4/1987 | Lacotte et al. .............. 156/196 |
| 4,659,605 A | 4/1987 | Malik et al. |
| 4,673,602 A | 6/1987 | Nakayama et al. ........... 428/65 |
| 4,678,547 A | 7/1987 | Miyamoto et al. |
| 4,690,846 A | 9/1987 | Wada et al. |
| 4,698,716 A | 10/1987 | Lazzari |
| 4,705,566 A | 11/1987 | Senda et al. |
| 4,708,919 A | 11/1987 | Shimkunas et al. |
| 4,709,361 A | 11/1987 | Dahlstrom et al. |
| 4,719,171 A | 1/1988 | Ikenaga et al. |
| 4,725,470 A * | 2/1988 | Katsuki .................... 428/65.3 |
| 4,726,998 A | 2/1988 | Ikenaga et al. |
| 4,731,155 A | 3/1988 | Napoli et al. ............... 156/643 |
| 4,737,877 A | 4/1988 | Krongelb et al. |
| 4,741,689 A | 5/1988 | Onizawa et al. |
| 4,742,420 A * | 5/1988 | Oishi ......................... 360/135 |
| 4,775,608 A | 10/1988 | Baum et al. |
| 4,789,722 A | 12/1988 | Jabloner et al. ............ 528/172 |
| 4,808,455 A | 2/1989 | Wada et al. |
| 4,809,110 A | 2/1989 | Hertrich |
| 4,810,527 A | 3/1989 | Geary, Jr. et al. .......... 427/54.1 |
| 4,816,351 A | 3/1989 | Takagi et al. ............... 428/694 |
| 4,825,680 A | 5/1989 | Coe et al. |
| 4,831,244 A | 5/1989 | Slafer et al. ................. 235/487 |
| 4,835,909 A | 6/1989 | Richter et al. |
| 4,839,244 A | 6/1989 | Tsukamoto |
| 4,841,501 A | 6/1989 | Izuka et al. |
| 4,845,142 A | 7/1989 | Niwano et al. |
| 4,851,455 A | 7/1989 | Job et al. ................... 522/139 |
| 4,851,494 A | 7/1989 | Eldin et al. ................ 528/170 |
| 4,870,429 A * | 9/1989 | Fujita et al. ................ 346/137 |
| 4,876,117 A | 10/1989 | Bornstein |
| 4,877,666 A | 10/1989 | Muchnik et al. |
| 4,885,339 A | 12/1989 | Traugott et al. ............ 525/132 |
| 4,885,649 A | 12/1989 | Das |
| 4,893,910 A | 1/1990 | Birecki |
| 4,896,292 A | 1/1990 | Eich et al. |
| 4,902,746 A | 2/1990 | Serini et al. |
| 4,908,826 A | 3/1990 | Hertrich |
| 4,911,966 A | 3/1990 | Murayama et al. |
| 4,911,967 A | 3/1990 | Lazzari |
| 4,920,441 A | 4/1990 | Kimura et al. |
| 4,923,942 A | 5/1990 | Takeyama et al. |
| 4,925,738 A | 5/1990 | Tsuya et al. |
| 4,931,147 A | 6/1990 | Legierse et al. |
| 4,953,385 A | 9/1990 | Aoki et al. |
| 4,956,015 A | 9/1990 | Okajima et al. |
| 4,964,934 A | 10/1990 | Gregg |
| 4,965,780 A | 10/1990 | Lee et al. |
| 4,971,932 A | 11/1990 | Alpha et al. |
| 4,975,327 A | 12/1990 | Somasiri et al. ............ 428/409 |
| 4,975,358 A | 12/1990 | Sonnenschein et al. |
| 4,976,902 A | 12/1990 | Oberle ........................ 264/54 |
| 4,983,335 A | 1/1991 | Matsuo et al. |
| 4,985,306 A | 1/1991 | Morizane et al. |
| 4,986,938 A | 1/1991 | Izuka et al. |
| 4,987,020 A | 1/1991 | Bonnebat et al. ............. 428/64 |
| 4,996,622 A | 2/1991 | Takatsuki et al. |
| 4,999,234 A | 3/1991 | Cowan |
| 5,002,706 A | 3/1991 | Yamashita |
| 5,014,259 A | 5/1991 | Goldberg et al. |
| 5,018,128 A | 5/1991 | Goldberg |
| 5,018,962 A | 5/1991 | Kitamura et al. |
| 5,047,274 A | 9/1991 | Tsuya et al. |
| 5,059,473 A | 10/1991 | Takahashi et al. |
| 5,063,096 A | 11/1991 | Kohara et al. |
| 5,063,097 A | 11/1991 | Hirota et al. ................. 428/65 |
| 5,068,065 A | 11/1991 | Maus et al. |
| 5,074,971 A | 12/1991 | Tsuya et al. |
| 5,078,947 A | 1/1992 | Nishizawa et al. ........... 264/1.1 |
| 5,082,696 A | 1/1992 | Sharp ........................ 427/255 |
| 5,082,728 A | 1/1992 | Miyake et al. |
| 5,084,355 A | 1/1992 | Takahashi et al. |
| 5,087,340 A | 2/1992 | Onagi et al. |
| 5,087,481 A | 2/1992 | Chen et al. |
| 5,091,225 A | 2/1992 | Goto |
| 5,093,174 A | 3/1992 | Suzuki et al. |
| 5,094,796 A | 3/1992 | Katoh et al. ................. 264/313 |
| 5,094,884 A | 3/1992 | Hillman et al. ............. 427/240 |
| 5,094,925 A | 3/1992 | Ise et al. |
| 5,096,563 A | 3/1992 | Yoshizawa et al. |
| 5,097,370 A | 3/1992 | Hsia |
| 5,100,741 A | 3/1992 | Shimoda et al. |
| 5,106,553 A | 4/1992 | Onisawa et al. |
| 5,108,781 A | 4/1992 | Ranjan et al. |
| 5,109,377 A | 4/1992 | Yamamoto et al. |
| 5,112,662 A | 5/1992 | Ng |
| 5,112,701 A | 5/1992 | Katsuragawa |
| 5,118,771 A | 6/1992 | Inoue et al. |
| 5,119,259 A | 6/1992 | Kikuchi ..................... 360/135 |
| 5,120,603 A | 6/1992 | Schmidt |
| 5,128,922 A | 7/1992 | Inui et al. |
| 5,130,356 A | 7/1992 | Feuerherd et al. |
| 5,131,977 A | 7/1992 | Morizane et al. |
| 5,135,791 A | 8/1992 | Imai et al. |
| 5,137,617 A | 8/1992 | Helfet et al. |
| 5,137,991 A | 8/1992 | Epstein et al. |
| 5,143,797 A | 9/1992 | Hashima et al. |
| 5,159,511 A | 10/1992 | Das |
| 5,161,134 A | 11/1992 | Lee |
| 5,164,465 A | 11/1992 | Epstein et al. |
| 5,166,014 A | 11/1992 | Ledieu |
| 5,171,585 A | 12/1992 | Onisawa et al. |

| | | |
|---|---|---|
| 5,177,656 A | 1/1993 | Hughes |
| 5,178,926 A | 1/1993 | Tanaka et al. |
| 5,188,863 A | 2/1993 | de Graaf et al. ............ 427/512 |
| 5,191,563 A | 3/1993 | Lee et al. |
| 5,193,039 A | 3/1993 | Smith et al. |
| 5,199,090 A | 3/1993 | Bell |
| 5,202,880 A | 4/1993 | Lee et al. |
| 5,209,837 A | 5/1993 | Tsuya et al. |
| 5,226,955 A | 7/1993 | Owaki et al. |
| 5,230,025 A | 7/1993 | Fishbine et al. |
| 5,234,717 A | 8/1993 | Matsuno et al. |
| 5,242,630 A | 9/1993 | Nuij et al. ................... 264/1.3 |
| 5,242,761 A | 9/1993 | Uchiyama |
| 5,267,112 A | 11/1993 | Batra et al. |
| RE34,506 E | 1/1994 | Dobbin et al. |
| 5,276,098 A | 1/1994 | Kohara et al. |
| 5,292,550 A * | 3/1994 | Fujii et al. ................... 427/165 |
| 5,296,528 A | 3/1994 | Lütjens et al. |
| 5,309,303 A | 5/1994 | Hsia et al. |
| 5,311,376 A | 5/1994 | Joan et al. |
| 5,335,526 A | 8/1994 | Garrison et al. ................ 72/47 |
| 5,354,517 A | 10/1994 | Yamasaki et al. |
| 5,354,985 A | 10/1994 | Quate |
| 5,366,542 A | 11/1994 | Yamada et al. |
| 5,374,462 A | 12/1994 | Funaki et al. .................. 428/64 |
| 5,379,439 A | 1/1995 | Harrison et al. |
| 5,391,522 A | 2/1995 | Goto et al. |
| 5,392,263 A | 2/1995 | Watanabe et al. |
| 5,395,803 A | 3/1995 | Adams ........................ 437/229 |
| 5,400,317 A | 3/1995 | Strasser et al. |
| 5,409,756 A | 4/1995 | Ikeda et al. .................... 428/64 |
| 5,427,599 A | 6/1995 | Greschner et al. ............. 65/305 |
| 5,437,887 A | 8/1995 | Yarkosky et al. |
| 5,441,788 A | 8/1995 | Bloomquist et al. |
| 5,447,767 A | 9/1995 | Tanabe et al. ............. 428/64.4 |
| 5,452,282 A | 9/1995 | Abraham .................... 369/603 |
| 5,453,168 A | 9/1995 | Nelson et al. |
| 5,453,961 A | 9/1995 | Brazas |
| 5,468,324 A | 11/1995 | Hong |
| 5,469,312 A | 11/1995 | Watanabe et al. |
| 5,470,627 A | 11/1995 | Lee et al. |
| 5,489,774 A | 2/1996 | Akamine et al. |
| 5,490,131 A | 2/1996 | Ohta et al. |
| 5,493,454 A | 2/1996 | Ziperovich et al. |
| 5,504,638 A | 4/1996 | Kinoshita et al. ........ 360/98.08 |
| 5,510,164 A | 4/1996 | Best et al. |
| 5,515,346 A | 5/1996 | Watanabe et al. |
| 5,516,899 A | 5/1996 | Campbell et al. |
| 5,532,192 A | 7/1996 | Adams ........................ 437/229 |
| 5,533,001 A | 7/1996 | Watanabe et al. |
| 5,533,002 A | 7/1996 | Abraham ................. 369/275.3 |
| 5,536,549 A | 7/1996 | Nelson et al. |
| 5,537,034 A | 7/1996 | Lewis |
| 5,538,774 A | 7/1996 | Landin et al. |
| 5,552,009 A | 9/1996 | Zager et al. ................. 156/220 |
| 5,561,089 A | 10/1996 | Ishizaki et al. |
| 5,567,217 A | 10/1996 | Goto et al. |
| 5,582,891 A | 12/1996 | Murakami et al. |
| 5,583,705 A | 12/1996 | Ziperovich et al. |
| 5,585,159 A | 12/1996 | Miyake et al. |
| 5,585,989 A | 12/1996 | Kuromiya et al. |
| 5,590,115 A | 12/1996 | Kubo |
| 5,591,501 A | 1/1997 | Ovshinsky et al. ......... 428/64.1 |
| 5,622,816 A | 4/1997 | Maenza et al. |
| 5,626,886 A | 5/1997 | Ishii ........................... 425/116 |
| 5,626,920 A | 5/1997 | Weir et al. |
| 5,626,935 A | 5/1997 | Goto et al. |
| 5,629,417 A | 5/1997 | Campbell et al. |
| 5,635,269 A | 6/1997 | Weir et al. |
| 5,657,304 A | 8/1997 | Lehureau ..................... 369/109 |
| 5,663,016 A | 9/1997 | Hong |
| 5,666,237 A | 9/1997 | Lewis |
| 5,669,995 A | 9/1997 | Hong |
| 5,681,635 A | 10/1997 | Nelson et al. |
| 5,688,574 A | 11/1997 | Tamura et al. ............. 428/64.1 |
| 5,689,480 A | 11/1997 | Kino |
| 5,691,256 A | 11/1997 | Taguchi et al. |
| 5,707,705 A | 1/1998 | Nelson et al. |
| 5,723,033 A | 3/1998 | Weiss |
| 5,726,108 A | 3/1998 | Taguchi et al. |
| 5,729,393 A | 3/1998 | Lee et al. |
| 5,730,922 A | 3/1998 | Babb et al. .................. 264/258 |
| 5,741,403 A * | 4/1998 | Tenhover et al. ......... 204/192.2 |
| 5,751,452 A | 5/1998 | Tanaka et al. |
| 5,772,905 A | 6/1998 | Chou .......................... 216/44 |
| 5,781,526 A | 7/1998 | Nishizawa et al. ...... 369/275.3 |
| 5,789,756 A | 8/1998 | Guzik |
| 5,800,895 A | 9/1998 | Vygovsky et al. |
| 5,800,904 A | 9/1998 | Hallman et al. ............. 428/156 |
| 5,804,017 A | 9/1998 | Hector |
| 5,807,498 A | 9/1998 | Gibbons et al. |
| 5,808,830 A | 9/1998 | Stefansky et al. |
| 5,811,182 A | 9/1998 | Weir et al. |
| 5,814,400 A | 9/1998 | Kirino et al. |
| 5,820,769 A | 10/1998 | Chou |
| 5,831,309 A | 11/1998 | Englisch et al. |
| 5,838,654 A | 11/1998 | Kagawa et al. .......... 369/275.1 |
| 5,846,280 A | 12/1998 | Speit |
| 5,846,627 A | 12/1998 | Hong |
| 5,855,746 A | 1/1999 | Prabhakara et al. |
| 5,855,951 A | 1/1999 | Nelson et al. |
| 5,859,833 A | 1/1999 | Chatterjee et al. |
| 5,866,489 A | 2/1999 | Yamaguchi |
| 5,868,953 A | 2/1999 | Maekawa et al. |
| 5,871,654 A | 2/1999 | Mannami et al. |
| 5,874,376 A | 2/1999 | Taguchi et al. |
| 5,875,083 A | 2/1999 | Oniki et al. |
| 5,897,578 A | 4/1999 | Wiklund et al. |
| 5,900,126 A | 5/1999 | Nelson et al. |
| 5,900,318 A | 5/1999 | Yanagisawa |
| 5,902,172 A | 5/1999 | Utashiro |
| 5,907,448 A | 5/1999 | Watanabe et al. |
| 5,911,943 A | 6/1999 | Minghetti et al. .......... 264/516 |
| 5,948,495 A | 9/1999 | Stanish et al. |
| 5,967,030 A | 10/1999 | Blalock ...................... 100/211 |
| 5,968,627 A * | 10/1999 | Nigam et al. .............. 428/65.3 |
| 5,972,461 A | 10/1999 | Sandstrom ................. 428/64.3 |
| 5,981,015 A | 11/1999 | Zou et al. |
| 5,987,004 A | 11/1999 | Suwabe ...................... 369/290 |
| 6,010,761 A | 1/2000 | Tatewaki et al. ........... 428/64.1 |
| 6,027,801 A | 2/2000 | Maro et al. .................. 428/332 |
| 6,030,681 A | 2/2000 | Czubarow et al. |
| 6,062,133 A | 5/2000 | Blalock ...................... 100/211 |
| 6,066,380 A | 5/2000 | Oyanagi et al. |
| 6,094,413 A | 7/2000 | Guerra ...................... 369/275.1 |
| RE36,806 E | 8/2000 | Landin et al. ............. 428/64.1 |
| 6,096,419 A * | 8/2000 | Ito et al. ...................... 428/336 |
| 6,127,017 A | 10/2000 | Hirata et al. ............... 428/64.1 |
| 6,136,401 A | 10/2000 | Yamamoto et al. ........ 428/64.1 |
| 6,146,755 A * | 11/2000 | Guha et al. ................. 428/332 |
| 6,154,438 A * | 11/2000 | O'Hollaren et al. ...... 369/275.3 |
| 6,156,422 A | 12/2000 | Wu et al. .................... 428/332 |
| 6,165,391 A | 12/2000 | Vedamuttu .................. 264/1.33 |
| 6,183,829 B1 | 2/2001 | Daecher et al. ............ 428/64.1 |
| 6,191,053 B1 | 2/2001 | Chun et al. .................. 438/780 |
| 6,194,045 B1 | 2/2001 | Annacone et al. ......... 428/64.1 |
| 6,200,633 B1 | 3/2001 | Kitano et al. ............... 427/240 |
| 6,207,095 B1 | 3/2001 | Gosetti ........................ 264/250 |
| 6,214,429 B1 | 4/2001 | Zou et al. .................... 428/64.1 |
| 6,225,240 B1 | 5/2001 | You et al. .................... 438/782 |
| 6,232,247 B1 | 5/2001 | Gordon et al. .............. 438/780 |
| 6,236,542 B1 | 5/2001 | Hartog et al. |

| | | | | |
|---|---|---|---|---|
| 6,248,395 | B1 | | 6/2001 | Homola et al. ............. 427/129 |
| 6,328,920 | B1 | | 12/2001 | Uchiyama et al. .......... 264/255 |
| 6,335,843 | B1 | * | 1/2002 | Yotsuya et al. ............... 360/60 |
| 6,347,016 | B1 | | 2/2002 | Ishida et al. |
| RE37,599 | E | | 3/2002 | Lau et al. ................... 528/401 |
| 6,411,457 | B1 | | 6/2002 | Yamashita et al. ....... 360/73.03 |
| 6,433,964 | B1 | * | 8/2002 | Chang ........................ 360/133 |
| 6,492,035 | B1 | | 12/2002 | Yamaguchi et al. ........ 428/611 |
| 6,544,667 | B1 | | 4/2003 | Hosoe et al. ............... 428/664 |
| 6,764,734 | B1 | * | 7/2004 | Vierk et al. ................ 428/64.1 |
| 2001/0022705 | A1 | * | 9/2001 | Mori et al. ................. 360/135 |
| 2002/0173597 | A1 | | 11/2002 | Zarnoch et al. ............. 525/461 |

FOREIGN PATENT DOCUMENTS

| | | | |
|---|---|---|---|
| CA | 2259483 | | 1/1998 |
| DE | 4326296 A1 | | 2/1994 |
| DE | 4326296 A1 | * | 2/1994 |
| JP | 61-092814 A | * | 5/1986 |
| JP | 61-105725 A | * | 5/1986 |
| JP | 61-105725 | | 5/1986 |
| JP | 61-131232 | | 6/1986 |
| JP | 61-131232 A | * | 6/1986 |
| JP | 61-242327 A | * | 10/1986 |
| JP | 62-124625 A | * | 6/1987 |
| JP | 62-134836 | | 6/1987 |
| JP | 62-134836 A | * | 6/1987 |
| JP | S63-205817 | | 8/1988 |
| JP | 63205817 | | 8/1988 |
| JP | 02-096919 A | * | 4/1990 |
| JP | 02-096921 A | * | 4/1990 |
| JP | 6-4916 | | 1/1994 |
| JP | 6-12715 | | 1/1994 |
| JP | 06004908 A | | 1/1994 |
| JP | 06004916 A | | 1/1994 |
| JP | 06012715 A | | 1/1994 |
| JP | 06020316 A | | 1/1994 |
| JP | 06119668 A | | 4/1994 |
| JP | 06150419 A | | 5/1994 |
| JP | 06158281 A | | 6/1994 |
| JP | 06162583 A | | 6/1994 |
| JP | 6-187683 | | 7/1994 |
| JP | 06187683 A | | 7/1994 |
| JP | 06-195700 A | * | 7/1994 |
| JP | 6-4908 | | 11/1994 |
| JP | 6-20516 | | 11/1994 |
| JP | 06309714 A | | 11/1994 |
| JP | 09237437 | | 9/1997 |
| JP | 10-247318 A | * | 9/1998 |
| WO | WO 8706385 | | 10/1987 |
| WO | WO 00/21689 | | 2/2000 |
| WO | WO 00/00868 | | 6/2000 |

OTHER PUBLICATIONS

JPO Abstract Translation of JP 61–131232–A (JPO Image No. JP361131232A).*

Derwent Abstract Translation of JP 62–124625–A (Derwent Acc. No. 1987–195402).*

JPO Abstract Translation of JP 61–105725–A (JPO Image No. JP361105725A).*

JPO Abstract Translation of JP 62–134826–A (JPO Image No. JP362134836A).*

Derwent Abstract Translation of JP 02–096921–A (Derwent Acc. No. 1990–151944).*

Derwent Abstract Translation of JP 02–096919–A (Derwent Acc. No. 1990–151942).*

Derwent Abstract Translation of JP 61–092814–A (Derwent Acc. No. 1986–159517).*

Derwent Abstract Translation of JP 61–242327–A (Derwent Acc. No. 1986–323715).*

Derwent Abstract Translation of JP 10–247318–A (Derwent Acc. No. 1998–552877).*

Derwent Abstract Translation of DE 4326296–A1 (Derwent Acc. No. 1994–066966).*

Derwent Abstract Translation of JP 06–195700–A (Derwent Acc. No. 1994–267230).*

English Translation of DE 43–26296 A1 (PTO 04–0670).*

English Abstract, Patent No. JP61–131232 A, Jun. 18, 1986 (2 pgs.).

English Abstract, Patent No. JP61–105725 A, May 23, 1986 (2 pgs.).

English Abstract, Patent No. JP62–134836 A, Jun. 17, 1987 (2 pgs.).

Odian, George. Principles of Polymerization, Third Edition. John Wiley and Sons, 1991. pp. 150–162.

Quantegy Professional Media, http://www.pncengineering.com/modSpec (4 pgs.).

International Search Report; International Application No. PCT/US 03/06775; International Filing Date Jul. 3, 2003; Date of Mailing Jul. 24, 2003.

Derwent Abstract for JP 09237437.

Derwent Abstract for JP 63089335.

HTML document titled "Flexural Properties", copyright 1995–2004, (http://www.dow.com/styron/design/guide/flexural.htm), 1 pg.

"Thermoplastic Composites Reinforced With Melt Processable Glass", R.T. Young and D.G. Baird (5 pages).

Phillips Research—Digital Video Recorder, http://www.research.phillips.com/pressmedia/highlights (2 pages).

Maxell Device: DVD–RAM, http://www.maxell.co.ip/eng/device/dvd–ram/profile.html (2 pages).

AV & Development Center, http://www.pioneer.co/ip/erdl/av.htlm (1 page).

Near Field Recording—NFR, http://www.nswc.navy.mil/cosip/nov98 (5 pages).

Technical Info, http://209.24.93.3/tech_info/backgrounder.html (3 pages).

Stragetic Partners Home, http://209.24.93.3/partners/index.html (1 page).

TeraStor, http://www.terastor.com/news/, (6 pages).

The era of giant magnetoresistive heads, http://www.storage.ibm.com/hardsoft/diskdrdl/technolo/gmr/ (16 pages).

Chp 3: Emerging Optical Storage Technologies, http://itri.loyola.edu/opto/c3_s5.htm (4 pgs.).

Chp 3: Optical Storage in the Future, http://itri.loyola. (2 pages).

Chp 3: Overview of Optical Storage Systems, http://itri.loyola.edu/ (4 pages).

Chp 3: Comparison of Japaneses and U.S. R&D, http://itri.loyola.edu/ (1 page).

"Learning and Process Improvement during Production Ramp–Up", Christian Terwiesch and Roger E. Bohn, The Wharton School, University of California San Diego, Aug. 6, 1998 (33 pages).

"Magnetic Storage Research Aiming at High Areal Densities", R&D Magazine, Dec. 1998 (6 pages).

The WTEC High Density Data Storage Study, http://itri.loyola.edu/ (2 pages).

"Characterization of Magnetizing Process for Pre–Embossed Servo Pattern of Plastic Hard Disks", Shoji Tanaka et al., IEEE Transactions on Magnetics, vol. 30, No. 6, Nov. 1994 (3 pages).

Dispersed Concentration, David McKendrick, Report 98–03, Nov., 1998, http://www–irps.ucsd.edu/~sloan/papers (16 pages).

Proposal to the Alfred P. Sloan Foundation from The Graduate School of International Relations and Pacific Studies and The Center For Magnetic Recording Research, Feb. 19, 1998, http://ww–irps.ucse.edu/~sloan/papers/sloanprop98.html (27 pages).

"Use of high performance resins for the planarization of magnetic rigid disk substrates", IEEE Transactions on Magnetics (Nov. 1991), vol. 27, No. 6, pt.2, p. 5175–7 (Abstract) (1 page).

Planarizing coating using PMR polyimides (magnetic recording discs), IBM Technical Disclosure Bulletin (Oct. 1982) vol. 25, No. 5, p. 2453–4 (Abstract).

"Nanoimprint lithography", Stephen Y. Chou et al., 1996 American Vacuum Society p. 4129–4133.

"Imprint of sub–25 nm vias and trenches in polymers", Stephen Y. Chou et al., 1995 American Institute of Physics, p. 3114–3116.

"Nano–compact disks with 400 Gbit/in$^2$ storage density fabricated using nanoimprint lithography and read with proximal probe", Peter R. Krauss et al, 1997 American Institute of Physics, p. 3174–3176.

"Patterned Media: A Viable Route to 50 Gbit/in$^2$ and up for Magnetic Recording?", Robert J. White et al., IEEE Transactions on Magnetics, vol. 33, No. 1, Jan. 1997, p. 990–995.

Data Storage on Dec. 2, 1999, Article Date: Sep. 1998, "Patterned media: 200 Gb/in2 or bust" (10 pages).

Data Storage on Dec. 6, 1999, Article Date: Sep. 1997, "Patterned media promise superhigh storage densities" (10 pages).

"Recording Characteristics of Submicron Discrete Magnetic Tracks", S.E. Lambert et al., 1987 IEE, pp. 3690–3692.

"Direct nanoimprint of submicron organic light–emitting structures", Jian Wang et al, 1999 Appl. Phys. Lett., vol. 75, No. 18, Nov. 1, 1999, pp. 2767–2769.

"Lithographically induced self–construction of polymer microstructures for resistless patterning", Stephen Y. Chou et al., Appl. Phys. Lett., vol. 75, No. 7, Aug. 1999, p. 1004–1005.

Data Storage on Dec. 2, 1999, Article Date: May, 1999, "Patterned media: Giant step in magnetic storage" (7 pages).

Data Storage on Dec. 2, 1999, Article Date: Jan., 1999, "Magnetic Recording: the next 100 years" (10 pages).

Architecture of TeraStor's Near Field Recording Technology, http://209.24.93.3/tech_info, (8 pages).

"Facts About Near Field Recording", http://www.basis–gm-bh.de, (2 pages).

"US HDD Makers Turn to 10–Gbit/Inch$^2$ Near Field Record", http://www.nikkeibp.com, (8 pages).

"Facts About Near Field Recording", http://209.24.93.3/tech_info, (3 pages).

* cited by examiner

DATA STORAGE MEDIA UTILIZING A SUBSTRATE INCLUDING A PLASTIC RESIN LAYER, AND METHOD THEREOF

CROSS-REFERENCE TO RELATED APPLICATIONS

This application claims the benefit of the filing date of U.S. Provisional Application Ser. Nos. 60/120,101 filed Feb. 12, 1999; 60/134,585 filed May 17, 1999; 60/137,883 filed Jun. 7, 1999; 60/137,884 filed Jun. 7, 1999; 60/146,248 filed Jul. 29, 1999; and a division of U.S. application Ser. No. 09/502,968 filed Feb. 11, 2001, now abandoned, the entire contents of each application are hereby incorporated by reference.

FEDERALLY SPONSORED RESEARCH

Not Applicable

TECHNICAL FIELD

The present disclosure relates to data storage media, and especially relates to data storage media comprising at least a plastic portion.

BACKGROUND OF THE INVENTION

Optical, magnetic and magneto-optic media are primary sources of high performance storage technology, which enables high storage capacity coupled with a reasonable price per megabyte of storage. Areal density, typically expressed as billions of bits per square inch of disk surface area (Gbits per square inch ($Gbits/in^2$)), is equivalent to the linear density (bits of information per inch of track) multiplied by the track density in tracks per inch. Improved areal density has been one of the key factors in the price reduction per megabyte, and further increases in areal density continue to be demanded by the industry.

In the area of optical storage, advances focus on access time, system volume, and competitive costing. Increasing areal density is being addressed by focusing on the diffraction limits of optics (using near-field optics), investigating three dimensional storage, investigating potential holographic recording methods and other techniques.

Conventional polymeric data storage media has been employed in areas such as compact disks (CD-ROM) and recordable or re-writable compact disks (e.g., CD-RW), and similar relatively low areal density devices, e.g. less than about 1 $Gbits/in^2$, which are typically read-through devices requiring the employment of a good optical quality substrate having low birefringence.

Referring to FIG. 1, a low areal density system 1 is illustrated having a read device 3 and a recordable or re-writable storage media 5. The storage media 5 comprises conventional layers, including a data layer 7, dielectric layers 9 and 9', reflective layer 11, and protective layer 13. During operation of the system 1, a laser 15 produced by the read device 3 is incident upon the optically clear substrate 17. The laser passes through the substrate 17, and through the dielectric layer 9, the data layer 7 and a second dielectric layer 9'. The laser 15 then reflects off the reflective layer 11, back through the dielectric layer 9', the data layer 7, the dielectric layer 9, and the substrate 17 and is read by the read device 3.

Unlike the CD and beyond that of the DVD, storage media having high areal density capabilities, typically greater than 5 $Gbits/in^2$, employ first surface or near field read/write techniques in order to increase the areal density. For such storage media, although the optical quality of the substrate is not relevant, the physical and mechanical properties of the substrate become increasingly important. For high areal density applications, including first surface applications, the surface quality of the storage media can effect the accuracy of the reading device, the ability to store data, and replication qualities of the substrate. Furthermore, the physical characteristics of the storage media when in use can also effect the ability to store and retrieve data; i.e. the axial displacement of the media, if too great, can inhibit accurate retrieval of data and/or damage the read/write device.

Conventionally, the above issues associated with employing first surface, including near field, techniques have been addressed by utilizing metal, e.g., aluminum, and glass substrates. These substrates are formed into a disk and the desired layers are disposed upon the substrate using various techniques, such as sputtering. Possible layers include reflective layers, dielectric layers, data storage layers and protective layers. Once the desired magnetic layers have been added, the disk may be partitioned into radial and tangential sectors through magnetic read/write techniques. Sector structure may also be added through physical or chemical techniques, e.g. etching, however this must occur prior to the deposition of the magnetic layers.

As is evident from the fast pace of the industry, the demand for greater storage capacities at lower prices, the desire to have re-writable disks, and the numerous techniques being investigated, further advances in the technology are constantly desired and sought. What is needed in the art are advances in storage media substrate materials enabling storage media to be utilized in first surface, including near field, applications.

BRIEF SUMMARY OF THE INVENTION

Disclosed herein are various embodiments of data storage media. In one embodiment, the data storage media comprises: a substrate comprising at least one plastic portion, an edge lift height of less than about 8 micrometers, a surface roughness of less than about 10 Å, and an axial displacement peak of less than about 500μ under shock and/or vibration excitation; and at least one data layer on the substrate. The data layer can be at least partly read from, written to, or a combination thereof by at least one energy field, and, when the energy field contacts the storage media, the energy field is incident upon the data layer before it could be incident upon the substrate.

In another embodiment, the data storage media comprises: a substrate comprising at least one plastic portion and an axial displacement peak of less than about 500μ under shock and/or vibration excitation and a surface roughness of about 10 Å; and at least one data layer on the substrate. The data layer can be at least partly read from, written to, or a combination thereof by at least one energy field, and, when the energy field contacts the storage media, the energy field is incident upon the data layer before it could be incident upon the substrate. The storage media has an areal density of greater than about 10 $Gbit/in^2$.

In yet another embodiment, the data storage media comprises: a substrate comprising at least one plastic resin portion and a core, wherein said core further comprises a varied thickness; and at least one data layer disposed on said substrate.

Figure 1:
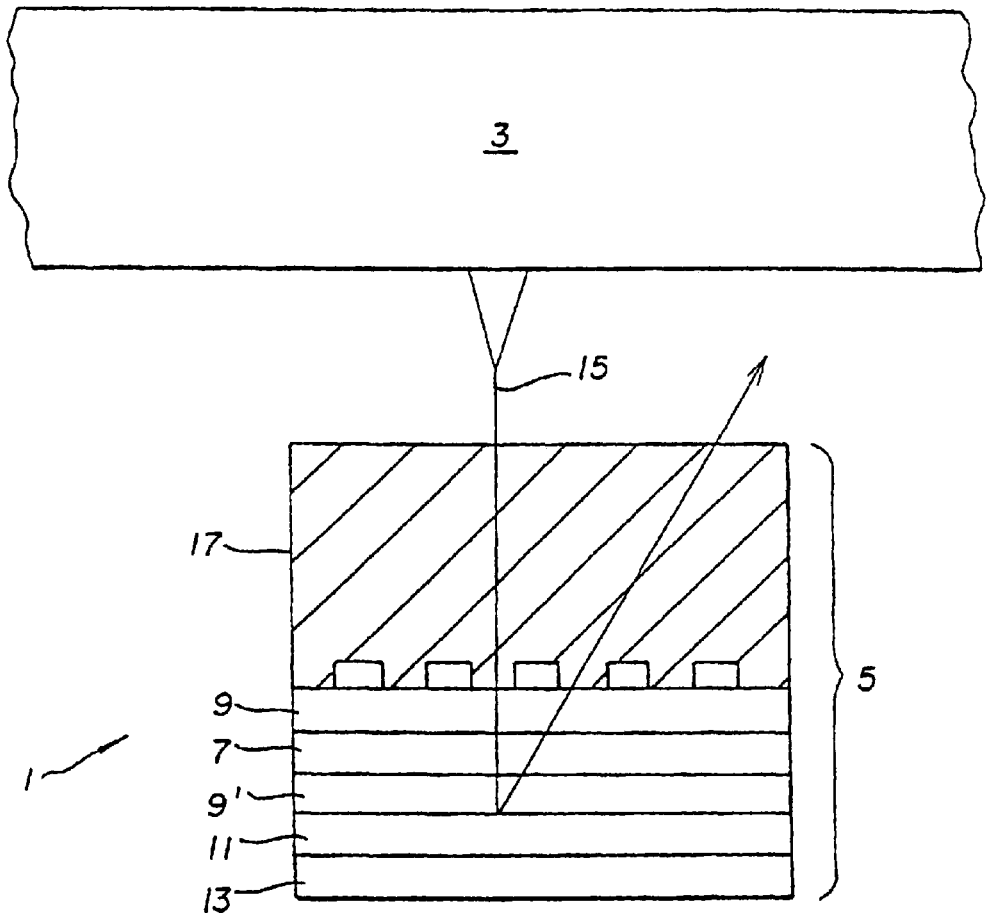
FIG. 1 is a cross-sectional illustration of a prior art low areal density system employing an optically clear substrate.

The above-described Figures are meant to be exemplary, not limiting, merely illustrating some of the potential embodiments of the present invention.

DETAILED DESCRIPTION OF THE INVENTION

The data storage media is partially or wholly comprised of a plastic material. This storage media is useful in high areal density applications, first surface and similar applications, wherein an energy field incident on the data storage layer(s) contacts the data storage layer(s) without or at least prior to contacting the substrate. In other words, in contrast to conventional compact disks (CDs) and similar applications, the energy field does not pass through the substrate to contact the data storage layer or reflect back through the substrate to the reading device. In order to function in such high areal density applications the storage media quality must exceed that of conventional CDs and related media. The storage media, compared to conventional CDs and similar media, should have a reduced axial displacement when excited by environmental and/or rotational vibrations, greater surface quality denoted by fewer irregularities or imperfections, and lower rotating moment of inertia (preferably about $5.5 \times 10^{-3}$ slug-in$^2$ or less, with about $4.5 \times 10^{-3}$ slug-in$^2$ or less more preferred, and about $4.0 \times 10^{-3}$ slug-in$^2$ or less especially preferred), among other qualities. Furthermore, the storage media preferably comprises areal densities exceeding about 5 Gbits/in$^2$, with greater than about 20 Gbits/in$^2$ more preferred, greater than about 50 Gbits/in$^2$ especially preferred, and up to or exceeding about 100 Gbits/in$^2$ anticipated.

Generally, in high areal density applications, i.e. about 5 Gbits/in$^2$ or greater, the read/write device is located relatively close to the surface of the storage media (stand-off distance). In general, the higher the density sought, the closer the read/write device should be to the surface of the storage media. Typically in these instances, the stand-off distance is generally less than about 0.3 millimeters (mm), and often less than about 760 nanometers (nm). For extremely high density, the read/write device is preferably extremely close, e.g., less than about 0.064 micrometers (μ), often less than about 0.013μ from the surface. Consequently, the axial displacement of the substrate should be sufficiently less than a tolerable system deflection distance in order to prevent damage to the read/write device and/or storage media surface during vibration and/or shock conditions. For example, for a disk (130 mm in outer diameter, 40 mm in inner diameter, and 1.2 mm in thickness) experiencing a sinusoidal gravitational loading of about 1 G, a resonant frequency of about 170 Hz, and a stand-off distance of about 0.051μ, an axial displacement in peak to peak measurement of less than about 250μ is preferred, with less than about 150μ more preferred, and less than about 125μ especially preferred for instances when damage to the substrate and/or the read/write device is a primary concern. Preferably, an axial displacement in peak to peak measurement of about 500μ or less, with about 250μ or less preferred, is maintained to a shock maximum of about 25 G's, with an about 2 to about 10 milliseconds (msec) application time and maintaining such a displacement to about 35 G's preferred. However, in other instances, e.g., those with a larger standoff distance (e.g., the about 0.30μ or more stand-off) damage to the head is not a dominating issue but rather, a very low axial displacement and/or disk tilt is preferred to allow for the optics to remain in focus since they may be incapable of responding to rapid changes in focal length. The maximum radial tilt and tangential tilt are independently about 1° or less, preferably, no more than about 1° each, and more preferably less than about 0.3° each, measured in a resting state (i.e., not spinning).

The substrate axial displacement is a function of several characteristics, including, but not limited to, the disk size requirements (inner and outer radii, and thickness), its stiffness (flexural modulus) and density, Poisson's ratio, loss modulus and storage modulus, and combinations thereof and others. As the disk's outer radius increases, the axial displacement of the disk under shock and vibration conditions also increases, and as the disk thickness decreases, its sectional stiffness decreases while its axial displacement increases. Currently, the dimensions of the storage media are specified by the industry to enable their use in presently available storage media reading/writing devices. Consequently, the storage media typically has an inner diameter of up to about 40 millimeters (mm) and an outer diameter of up to about 130 mm or greater, with an inner diameter of about 15 mm to about 40 mm and an outer diameter of about 65 mm to about 130 mm generally employed. The overall thickness typically employed is about 0.8 mm to about 2.5 mm, with a thickness up to about 1.2 mm typically preferred. Other diameters and thicknesses could be employed to obtain the desired architecture.

Figure 4:
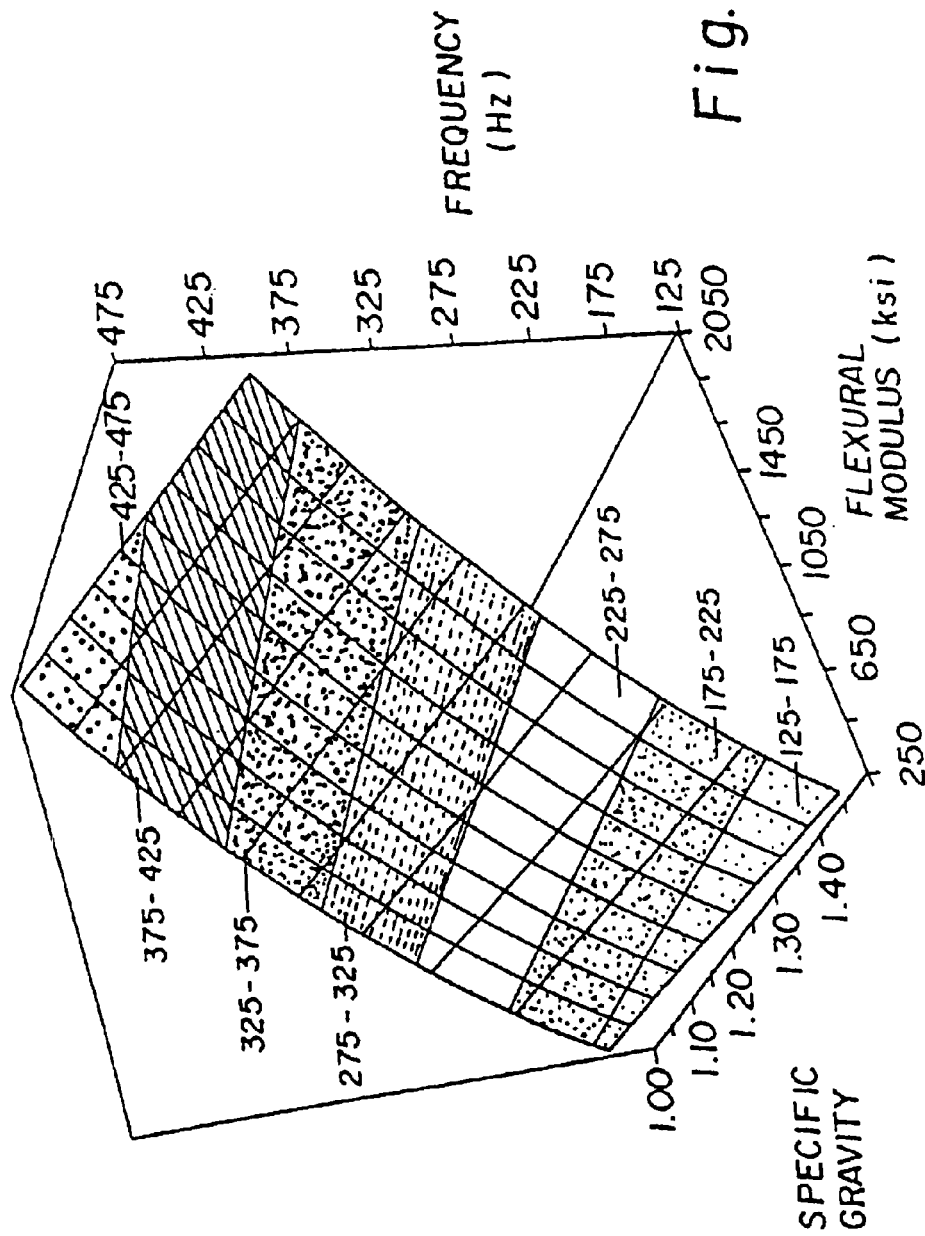
FIG. 4 is a graph of flexural modulus versus specific gravity for various fundamental axial modal frequencies of a monolithic disk having a 95 mm outer diameter by 0.8 mm thickness.

In addition to axial displacement, stiffness affects the fundamental frequencies for vibration of the substrate. It has been determined that the occurrence of the fundamental modal frequency can be adjusted based upon several factors, including material properties, e.g., the flexural modulus, thickness, and/or the specific gravity (S.G.)/density of the substrate or design architecture, e.g. internal/external stiffeners. (See FIG. 4) Since the modal frequencies define the frequency at which the substrate naturally resonates, displacing the disk out of plane, it is preferred to have the substrate's first modal frequency outside of the storage media's normal operating frequency. Normal operating frequencies are typically about 20 Hz to about 500 Hz, with greater than 500 Hz anticipated for future applications. Consequently, the substrate preferably possesses a flexural modulus/density which places the first modal frequency outside of the storage media's operating frequency. As is evident from FIG. 4 (whose properties are set forth in the Table below) the interrelationship of flexural modulus and specific gravity/density greatly affects the desired substrate flexural modulus and density. Preferably, the stiffness should be high and the density should be low. Typically, the flexural modulus should be about 250 thousand pounds per square inch (kpsi) or greater, with a flexural modulus of about 350 kpsi or greater preferred, about 500 kpsi or greater more preferred, and a flexural modulus of about 1000 kpsi or greater especially preferred, while the specific gravity is preferably about 1.5 or less, with a specific gravity of about 1.3 or less more preferred, and a specific gravity of about 1.0 or less especially preferred.

As with the axial displacement, due to the small stand-off distances employed and the deleterious effect of surface roughness on carrier-to-noise ratio, the substrate should have a high surface quality, particularly in the area of the storage media where the data is stored, and should be substantially flat to inhibit damage to the read/write device or surface of the storage media, and to enable accurate data deposit and retrieval. Preferably, the substrate has at least a portion of its surface with an average surface roughness (($R_a$) as measured by atomic force microscopy) of less than about 100 Angstroms (Å), preferably with a roughness of less than about 10 Å, and more preferably with a roughness of less than about 5 Å. (Roughness is typically an average of a 10µ by 10µ area of the substrate.) The microwaviness of the surface, which is typically an average of a 1 mm by 1 mm area, can be up to about 100 Å, with up to about 10 Å preferred, and up to about 5 Å especially preferred. With respect to the flatness (also known as "run-out"), a substantially flat substrate essentially free of ridges or valleys, is especially preferred. A run-out of up to about 100µ can be employed, with a run-out of up to about 10µ preferred, and a run-out up to about 5µ especially preferred. (Flatness is typically an average of the area of the entire disk.)

At such small stand-off distances, a ridge at or near the edge of the substrate, commonly known as edge-lift or ski-jump, can cause damage to the read/write device. The substrate should have a edge-lift height of less than about 8µ, with less than about 5µ preferred, and less than about 3µ especially preferred, with an edge-lift length of less than about 800µ preferred, and less than about 500µ especially preferred.

The storage media can be used in a variety of systems, some of which will employ a restraining device necessitating consideration of stiffness decay of the substrate. For a read/write system which employs a clamp, hub, or other restraining device to secure the storage media, the substrate should have a sufficient yield stress (at least in the contact area of the restraining device) to avoid mechanical decay (both based upon time and/or temperature). For a storage media having an outer diameter of about 65 mm to about 130 mm, that will be secured within a restraining device of a read/write system, the plastic resins to be used have a preferred yield stress of about 7,000 psi or greater, with a yield stress exceeding about 9,000 psi especially preferred. In the case of filled engineering plastic resins, higher yield stresses are obtainable, and yield stress exceeding about 10,000 pounds per square inch (psi) are preferred, with greater than about 15,000 psi especially preferred.

Figure 25:
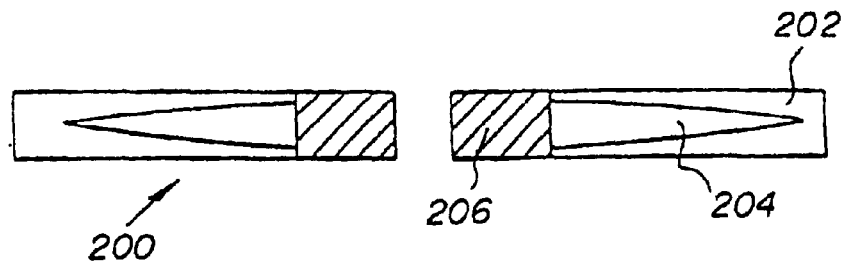
FIG. 25 is a cross-sectional view of one embodiment of a tri-component disk of the present invention.
Figure 26:
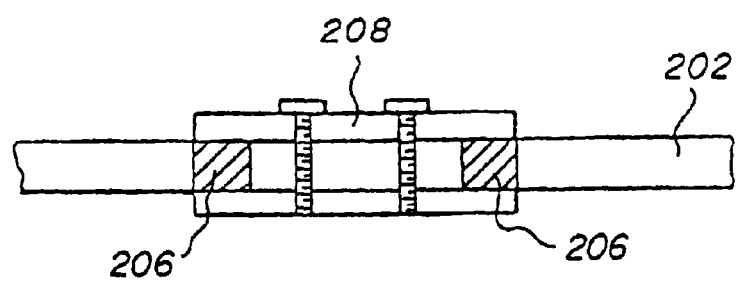
FIG. 26 is a cross-sectional view of another embodiment of a disk of the present invention secured with a clamp.
Figure 27:
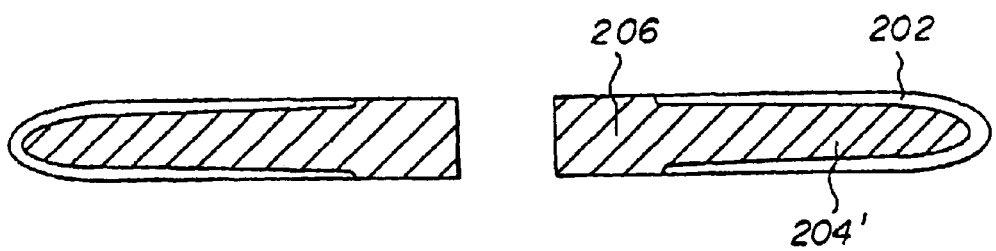
FIG. 27 is a cross-sectional view of yet another embodiment of the present invention having a thin plastic film disposed on a portion of a core.
Figure 28:
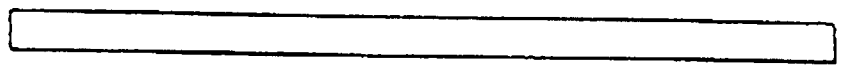
FIGS. 28 to 32 illustrate various embodiments of possible substrate geometries for the substrate of the present invention.
Figure 29:
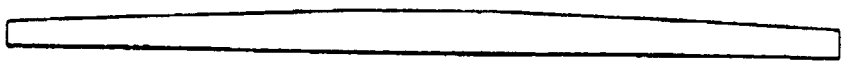
Figure 30:
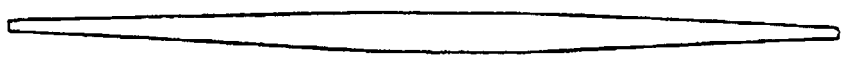
Figure 31:
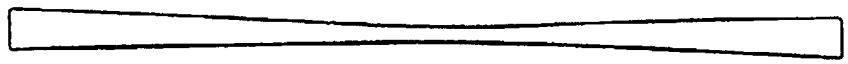
Figure 32:
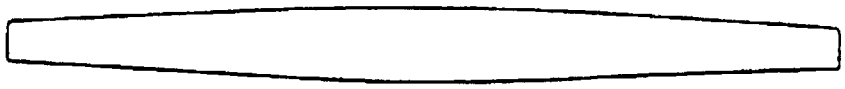

Some such disks are illustrated in FIGS. 25 to 27. FIG. 25 illustrates a disk 200 having a polymer surface 202, a filled or hollow core 204, with a central portion 206 of a material comprising a higher yield stress than the plastic 202, such as a metal (e.g., aluminum), glass, ceramic, metal-matrix composite, and alloys and combinations comprising at least one of the foregoing, and the like. FIG. 26 illustrates a disk having a high yield stress central portion 206 attached to a clamp 208. Meanwhile, FIG. 27 illustrates yet another embodiment wherein the polymer is a thin film over a core 204' composed of the same material as the central portion 206. For example, the core can be metal with a plastic film 202 disposed over a portion or all of the core.

Conventional substrates, e.g., aluminum and ceramic substrates without a plastic overlay, have a very high stiffness (e.g., aluminum with a Young's modulus of about 70 gigapascals (GPa), and ceramic with a Young's modulus of about 200 GPa), a level above that which has been achieved with plastic substrates. It was unexpectedly found that the damping coefficient of a material is important to offset the decreased stiffness of plastic substrates as compared to aluminum. Consequently, in order to minimize effects of vibration of the disk, the visco-elastic material properties of the substrate can be adjusted to enable damping capabilities. Vibration damping is achieved in a general sense, for example, by inserting an appropriate spring/dashpot assembly between a vibration source and an object to be vibrated. For effective damping, the material should absorb and/or dissipate the energy of vibration transmitted through the material as energy (e.g., heat energy) converted as a result of planar shearing or bulk compression and expansion of the material.

| Mechanical Input Properties for 130 mm ABA Co-Injected Disk | | | | |
|---|---|---|---|---|
| Structure | Material | Storage Modulus (psi) | Damping Coefficient | Poisson's Ratio | S.G. |
| Skin | Neat Resin | 3.15E + 05 | 0.033 | 0.385 | 1.200 |
| Core | Filled System | 1.25E + 06 | 0.040 | 0.375 | 1.315 |
|  |  | 1.25E + 06 | 0.060 | 0.375 | 1.320 |
|  |  | 1.25E + 06 | 0.080 | 0.375 | 1.325 |
|  |  | 1.25E + 06 | 0.100 | 0.375 | 1.330 |

For visco-elastic materials, such as plastic resins, there exists both a storage modulus and a loss modulus. Storage modulus represents elastic stiffness and loss modulus represents viscous stiffness. For a storage media having a stiffness less than aluminum, it is preferred that the substrate have a mechanical damping coefficient (defined as the ratio of the loss modulus over the storage modulus) of greater than about 0.04 at a temperature of 75° F. (about 24° C.), with greater than about 0.05 preferred, and greater than about 0.06 more preferred. A mechanical damping coefficient of greater than about 0.10 at a temperature of 75° F. is even more preferred, and a mechanical damping coefficient of greater than about 0.15 at a temperature of 75° F. is especially preferred.

In addition, the damping properties of the material may be optimized such that, for a frequency and temperature range of interest, the damping coefficient value does not drop below the desired value. In some embodiments, the temperature range of interest and frequency range for applicability of the dampening is about 75° F. (24° C.) and about 2 Hz to about 150° F. (65.5° C.) and about 400 Hz preferred, with about 32° F. (0° C.) and about 2 Hz to about 200° F. (93.3° C.) and about 500 Hz more preferred.

Figure 5:
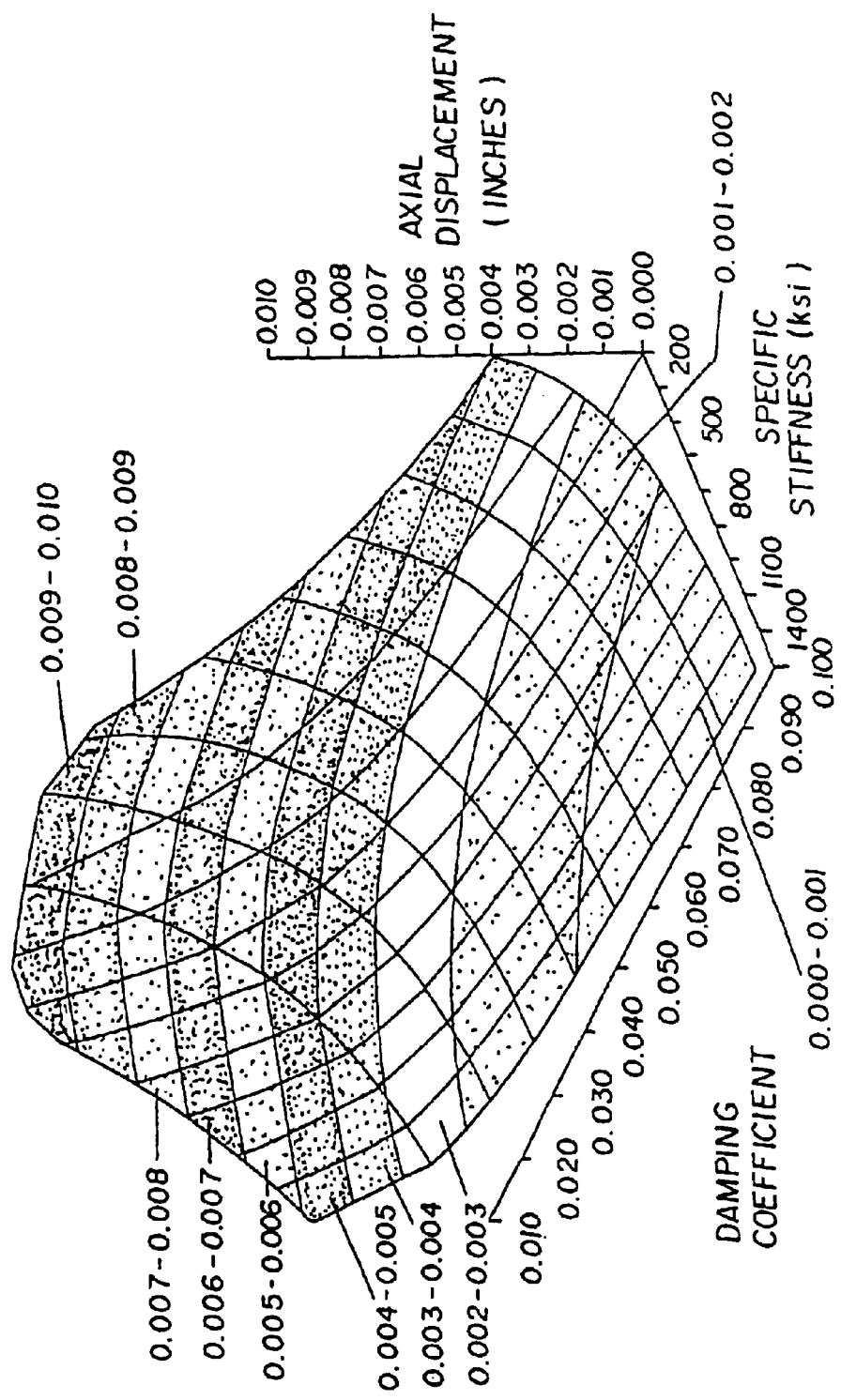
FIG. 5 is a graph of specific stiffness (flexural modulus divided by specific gravity) versus damping coefficient for various peak to peak axial displacements when excited by a 1 G sinusoidal load.
Figure 6:
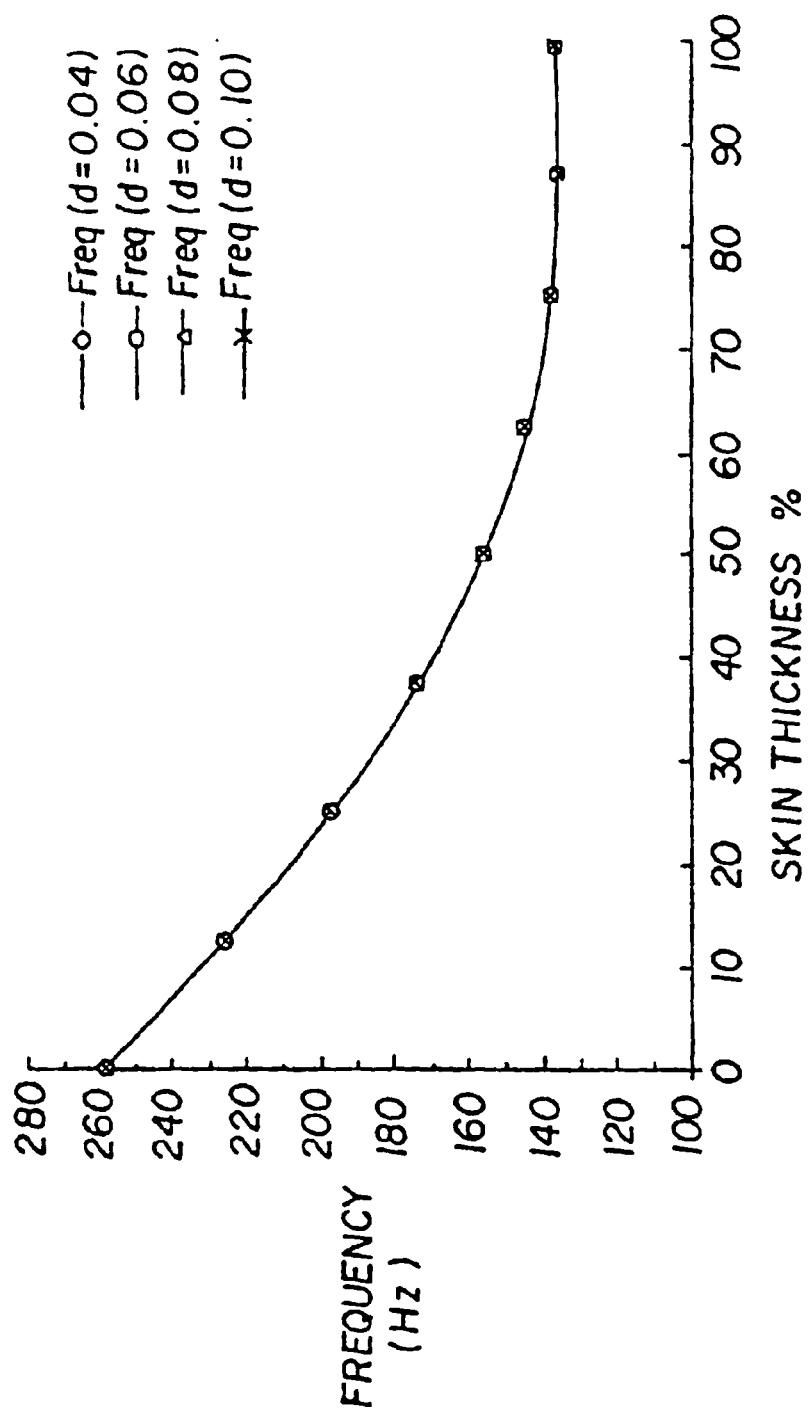
FIG. 6 is a graph representing the fundamental axial modal frequency for a multi layered composite 130 mm outer diameter by 1.2 mm thickness disk with homogeneous layers of neat and reinforced polymer.
Figure 7:
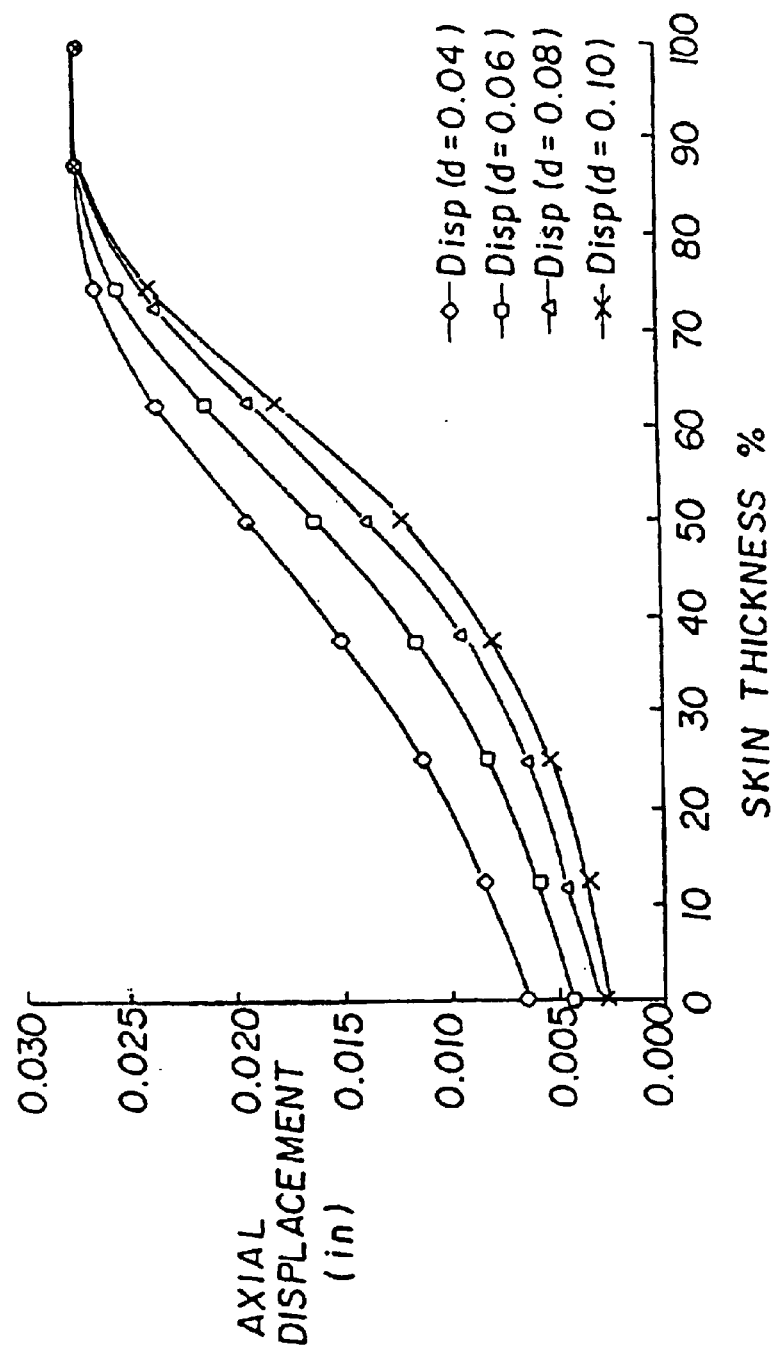
FIG. 7 is graph representing axial displacement peak to peak from vibration at the first fundamental frequency for a multi-layered composite (ABA co-injected disk) 130 mm outer diameter by 1.2 mm thickness disk having homogeneous layers of neat and reinforced polymer.
Figure 8:
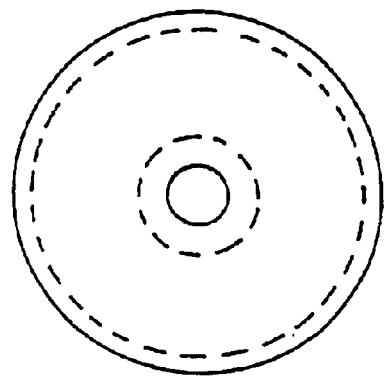
FIGS. 8 to 21 illustrate various cross-sectional and top views of embodiments of the present invention having a core/insert of material, or hollow or filled cavities, with the core/insert disposed at various locations, with various geometries.
Figure 9:
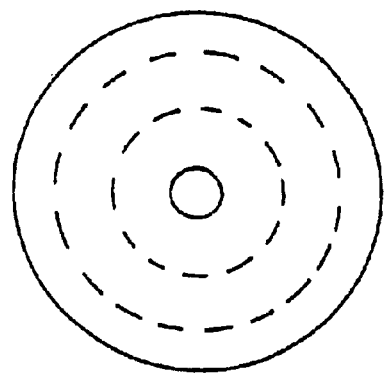
Figure 10:
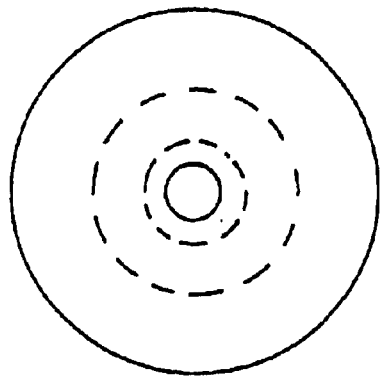
Figure 11:
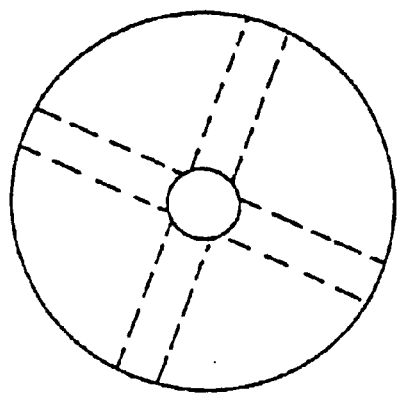
Figure 12:
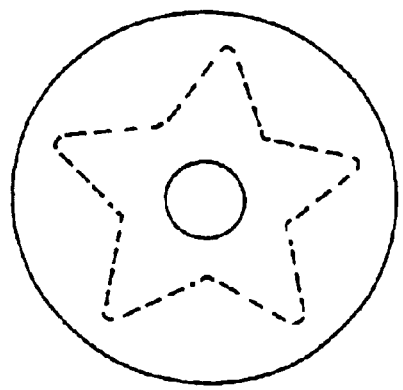
Figure 13:
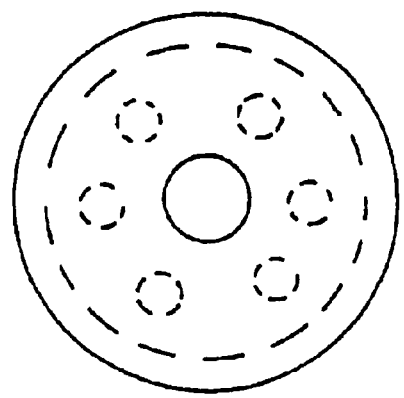
Figure 14:
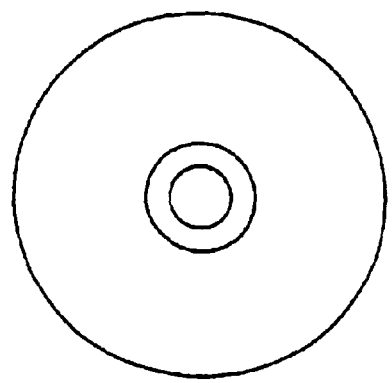
Figure 15:
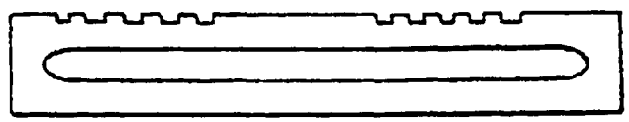
Figure 16:
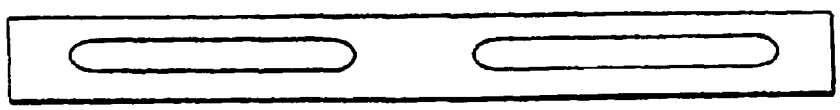
Figure 17:
Figure 18:
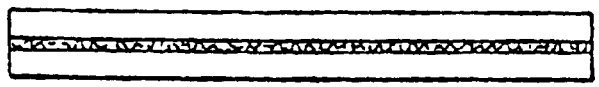
Figure 19:
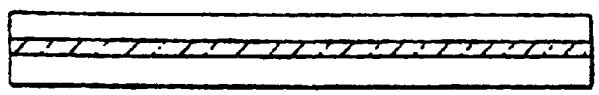
Figure 20:
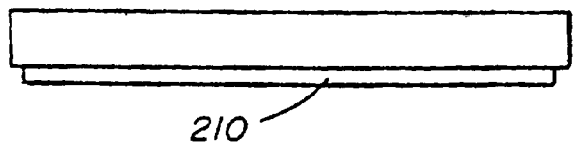
Figure 21:
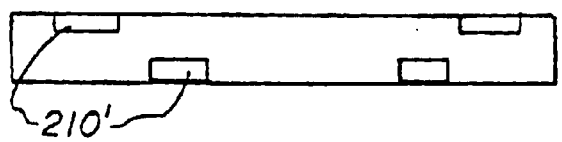

FIGS. 5 and 7 represent the relationship between axial displacement for a 1 G sinusoidal vibration load for various material properties and fixed geometries. FIG. 6 shows that the damping coefficient does not effect the first modal frequency while FIG. 7 shows the effects of axial displacement on the first modal frequency.

Damping, also referred to as dampening, can be achieved through a variety of approaches such as by addition of an energy absorbing component or through slip mechanisms involving various fillers and reinforcing agents. Useful materials that may improve the damping characteristics include elastic materials with high damping capabilities (e.g., a damping coefficient of greater than about 0.05), such as vulcanized rubbers, acrylic rubbers, silicone rubbers, butadiene rubbers, isobutylene rubbers, polyether rubbers, isobutylene-isoprene copolymers and isocyanate rubber, nitrile rubbers, chloroprene rubbers, chlorosulfonated polyethylene, polysulfide rubbers and fluorine rubber, block copolymers including polystyrene-polyisoprene copolymers such as described in U.S. Pat. No. 4,987,194 (which is incorporated herein by reference), thermoplastic elastomeric materials, including polyurethanes, and combinations comprising at least one of the foregoing, among others. Vibration-damping materials also include resins in which large amounts of particles (such as ferrites, metals, ceramics and the like), flakes (such as of talc, mica and the like), and various fibers (such as zinc oxide, wollastonite, carbon fibers, glass fibers, and the like), and mixtures comprising at least one of the foregoing, can be employed. Microfibers, fibrils, nanotubes, and whiskers, foamed and honeycombed structures may also be useful as are various combinations of the foregoing.

In addition to, or in place of, reducing axial displacement through the use of damping materials in the substrate, axial displacement can be reduced by utilizing a vibration damping material in the restraining device, or clamping structure, that holds the substrate. The addition of visco-elastic materials to the clamp or between the clamp and substrate effectively reduces axial displacement of the disk compared to the same structure without the additive. In one embodiment, the vibration-damping material should preferably have a damping coefficient higher than the damping coefficient of the disk substrate, and a modulus of elasticity high enough to reduce creep properties, e.g., a modulus of elasticity greater than about 20 kpsi. Useful materials that may improve the damping characteristics of the clamp include elastic materials with high damping capabilities, such as vulcanized rubbers, acrylic rubbers, silicone rubbers, butadiene rubbers, isobutylene rubbers, polyether rubbers, isobutylene-isoprene copolymers and isocyanate rubber, nitrile rubbers, chloroprene rubbers, chlorosulfonated polyethylene, polysulfide rubbers and fluorine rubber, block copolymers including polystyrene-polyisoprene copolymers such as described in U.S. Pat. No. 4,987,194, thermoplastic elastomeric materials, including polyurethanes, and combinations thereof, among others. Foamed or honeycomb structures can also be useful.

Other factors which effect the stability and life of the storage media relate to dimensional stabilities and hygrothermal properties. A substrate with thermal and moisture dimensional stabilities at temperatures within the storage and operating temperature range of the storage media should be employed with thermal and moisture stabilities at temperatures of about −6° C. (21° F.) to about 40° C. (104° F.) typically acceptable, stabilities within temperatures of about −12° C. (10° F.) to about 80° C. (175° F.) preferred, and stabilities within temperatures of about −16° C. (3° F.) to about 100° C. (212° F.) especially preferred. Due to the varied environments in which the storage media may be employed or stored, the storage media preferably has: (1) a heat distortion temperature greater than about 60° C. (140° F.), with greater than about 80° C. preferred; (2) creep characteristics preferably equal to or better than that of bisphenol-A based polycarbonate resin; and (3) good hygrothermal properties such that the substrate does not significantly change shape, such as bow or warp. Preferably, the substrate's moisture content varies less than about 1.0% at equilibrium, with less than about 0.5% at equilibrium more preferred, and less than about 0.3% at equilibrium especially preferred, under test conditions of 80° C. at 85% relative humidity after 4 weeks.

In order to address the above design issues, this substrate can be homogenous or non-homogenous, and can have numerous geometries. The homogenous substrate can be a plastic, which is substantially solid or may contain a varying degree of porosity or one or more cavities (see FIGS. 15, 16 17, and 33 to 35). As is illustrated in these Figures, the density of the substrate can be reduced by employing one or more hollow cavities (holes, bubbles, ribs, passageways, webs, etc.) within the substrate while maintaining a sufficiently smooth surface either by containing the cavities within the substrate or by utilizing a coating over the substrate in the area of the storage media where the data will be stored.

The size, shape, and location of the cavities is based upon the above mentioned design criteria. For example, referring to FIG. 17, the cavities may be located near the outer diameter of the substrate such that the central area of the substrate, which may be secured to the hub of the media read/write system, has the maximum yield strength while the outer periphery of the substrate has reduced density and inertial issues. As can be seen in FIGS. 8 to 14, and 33 to 35, the cavity can have various geometries (linear, curved, convex, concave, convexo-concave, concavo-concave, convexo-convex, and the like), sizes (width, length and height), and locations throughout the substrate (intermittent, from the inner diameter to the outer diameter, or any location therebetween), and can be interconnecting or separate.

The non-homogenous substrate can be a plastic with a filler, core, or other reinforcement or insert, or may be a composite material, or combinations thereof (see FIGS. 8 to 27). As is shown in the various drawings and as stated below in greater detail, the material geometry, location, and size of the insert/core/reinforcement can be adjusted to address the various design criteria; such as interconnecting or separate, solid or non-solid, plates, web designs, hub designs, stiffening structures, inner diameter and/or outer diameter inserts, top, middle, bottom, or offset designs, finger or directional design, concentric stiffeners, partial surface, welded, bonded, or encapsulated; or combinations comprising at least one of the foregoing.

Figure 22:
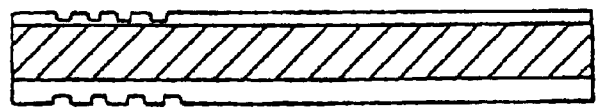
FIG. 22 is an embodiment similar to FIG. 19 illustrating a non-homogenous (ABA) substrate with pits or grooves.
Figure 23:
FIGS. 23 and 24 are cross-sectional views of additional embodiments of the present invention illustrating a substrate having thin plastic film.
Figure 24:

Referring to FIGS. 22 to 24, for example, a substrate can have a reinforcement that comprises substantially all of the volume of the substrate such that the majority of the plastic is merely disposed near the surface of the substrate, e.g., as a thin film. In this embodiment, the core, which forms the majority of the substrate, can have a thickness up to about 2.5 mm, with a thickness of about 0.75 mm to about 2.0 mm preferred, and about 0.8 mm to about 1.2 mm especially preferred. As is illustrated, the thin plastic film can be disposed on one or both sides of the core (e.g., metal, ceramic, glass, or the like). Typically a plastic film having a thickness of about 50μ or less can be employed, with a thickness of about 20μ or less preferred.

Regardless of whether the substrate is homogenous or non-homogenous, contains hollow or filled cavities, or reinforcement, its geometry as well as the geometry of the core/insert/reinforcement, can also be adjusted, interchangeably, to address various of the design factors. Referring to FIGS. 8 to 35, various substrate and core/insert geometries, respectively, include substantially constant thickness, tapering on one or both sides, convex or concave on one or both sides, or combinations comprising at least one of the foregoing.

Figure 36:
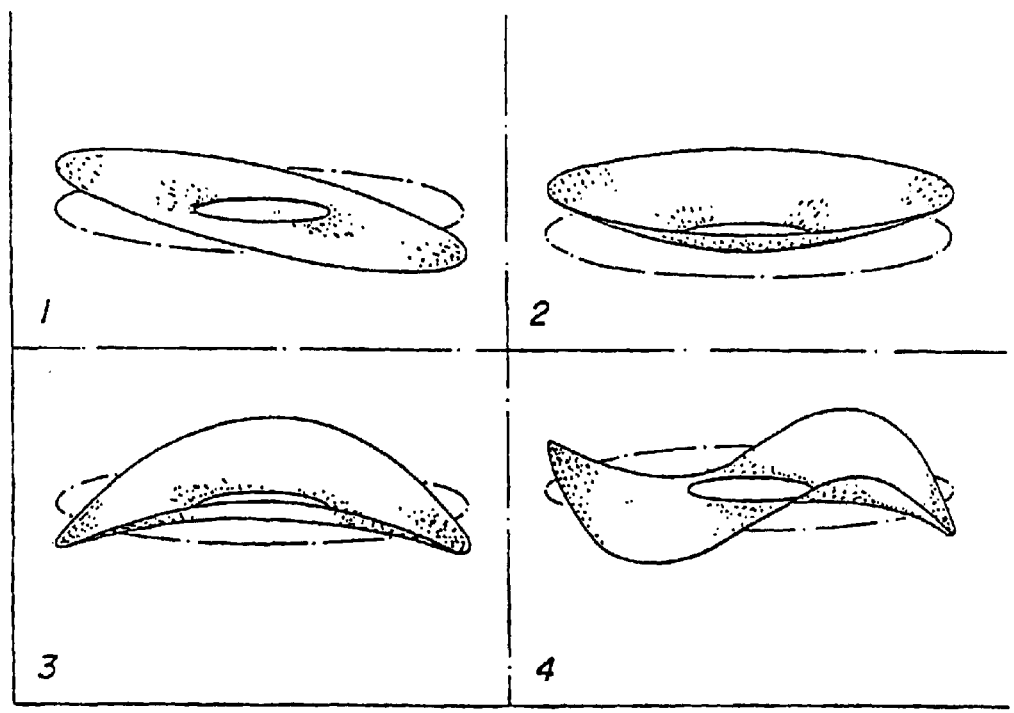
FIG. 36 illustrates modal shapes obtained from with a 130 mm disk via chirp excitation.

Adjusting the geometry of the substrate enables manipulation of the moment of inertia of the substrate when rotating, and control of the modal responses, i.e. the harmonics thereof. For example, various modal shapes (as shown in FIG. 36) can be obtained and avoided, based upon sectional variations in density through planar and/or radial thickness. As stated above, the preferred design is a substrate having a first modal resonance frequency outside of the frequency range for which the storage media is designed.

Another manner of addressing the various design criteria for the storage media is addressing its use, such as its operating rotational speed which effects the speed in which data can be stored/retrieved. Conventionally, during use, storage media has been rotated at a constant speed. The media is brought to its operating rotational speed prior to any reading or writing. However, the storage media can be rotated at a varied speed where the speed increases during peak use periods while decreasing during normal use periods; or rotational speed can be varied in order to maintain constant linear velocity at different areas of the disk (e.g., inner vs. outer diameter). Such operating criteria will both conserve energy and potentially render some design criteria more important. Such criteria include, e.g., moment of inertia, modulus, density, viscoelasticity, thickness, and/or diameter to name a few. Storage media devices that change speeds make many of these criteria, e.g., moment of inertia and density, etc. of increased importance as compared to constant speed devices.

In theory, any plastic that exhibits appropriate properties and can be employed as the substrate, core, and/or coating. However, the plastic should be capable of withstanding the subsequent processing parameters (e.g., application of subsequent layers) such as sputtering (i.e. temperatures up to and exceeding about 200° C. (typically up to or exceeding about 300° C.) for magnetic media, and temperatures of about room temperature (about 25° C.) up to about 150° C. for magneto-optic media). That is, it is desirable for the plastic to have sufficient thermal stability to prevent deformation during the deposition steps. For magnetic media, appropriate plastics include thermoplastics with glass transition temperatures of at least 140° C. can be used, with greater than about 150° C. preferred, and greater than about 200° C. more preferred (e.g., polyetherimides, polyetheretherketones, polysulfones, polyethersulfones, polyetherethersulfones, polyphenylene ethers, polyimides, high heat polycarbonates, etc.); with materials having glass transition temperatures greater than about 250° C. more preferred, such as polyetherimide in which sulfonedianiline or oxydianiline has been substituted for m-phenylenediamine, among others, as well as polyimides, such as Probimide (or the dry powder equivalent, Matrimid 5218, from Ciba Geigy Chemical); combinations comprising at least one of the foregoing, and others.

Additionally, it is possible for thermosets to be used in the application provided the thermoset possess sufficient flow under the stamping conditions to permit formation of the desired surface features. As various applications may require polymers with different glass transition temperatures, it may be advantageous to be able to adjust the glass transition temperature of a plastic (homopolymer, copolymer, or blend) to achieve a film with the desired glass transition temperature. To this end, polymer blends, such as those described in U.S. Pat. No. 5,534,602 (to Lupinski and Cole, 1996), may be employed in the preparation of the coating solution. In this example, polymer blends provide, selectively, variable glass transition temperatures of about 190° C. to about 320° C.

Some possible examples of plastics include, but are not limited to, amorphous, crystalline and semi-crystalline thermoplastic materials: polyvinyl chloride, polyolefins (including, but not limited to, linear and cyclic polyolefins and including polyethylene, chlorinated polyethylene, polypropylene, and the like), polyesters (including, but not limited to, polyethylene terephthalate, polybutylene terephthalate, polycyclohexylmethylene terephthalate, and the like), polyamides, polysulfones (including, but not limited to, hydrogenated polysulfones, and the like), polyimides, polyether imides, polyether sulfones, polyphenylene sulfides, polyether ketones, polyether ether ketones, ABS resins, polystyrenes (including, but not limited to, hydrogenated polystyrenes, syndiotactic and atactic polystyrenes, polycyclohexyl ethylene, styrene-co-acrylonitrile, styrene-co-maleic anhydride, and the like), polybutadiene, polyacrylates (including, but not limited to, polymethylmethacrylate, methyl methacrylate-polyimide copolymers, and the like), polyacrylonitrile, polyacetals, polycarbonates, polyphenylene ethers (including, but not limited to, those derived from 2,6-dimethylphenol and copolymers with 2,3,6-trimethylphenol, and the like), ethylene-vinyl acetate copolymers, polyvinyl acetate, liquid crystal polymers, ethylene-tetrafluoroethylene copolymer, aromatic polyesters, polyvinyl fluoride, polyvinylidene fluoride, polyvinylidene chloride, tetrafluoroethylene fluorocarbon polymer (Teflons), as well as thermosetting resins such as epoxy, phenolic, alkyds, polyester, polyimide, polyurethane, mineral filled silicone, bis-maleimides, cyanate esters, vinyl, and benzocyclobutene resins, in addition to blends, copolymers, mixtures, reaction products and composites comprising at least one of the foregoing.

Figure 33:
FIGS. 33 to 35 illustrate various embodiments of possible core geometries for the storage media of the present invention.
Figure 34:
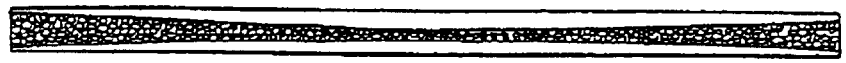
Figure 35:

Filler/reinforcement/core materials can be any material compatible with the plastic and the ultimate environment in which the storage media will be employed, which can be secured within or to the plastic, or which the plastic can be coated over, to produce the desired surface quality in the area of data storage, and which provides the additional desired mechanical strength to the substrate. Possible materials include: glass (such as silica, low melt glasses, etc.), foams and other low density materials, carbon, metals (such as aluminum, tin, steel, platinum, titanium, metal matrices, others and combinations and alloys comprising at least one of the foregoing), organic and inorganic materials, ceramics (e.g. SiC, $Al_2O_3$, etc.) thermoplastics, thermosets, rubbers, among others and composites, alloys and combinations comprising at least one of these materials. These materials can be in the form of particles, bubbles, microspheres or other hollow fillers, fibers (long, short, continuous, chopped, etc.), mesh, woven, non-woven, preforms, inserts, plates, disks, others and combinations comprising at least one of the foregoing, of various sizes and geometries. For example, FIGS. 33 to 35 show a few of the possible core/insert geometries with the polymeric material comprising a thin (e.g., less than about 50μ) coating or thick (e.g., greater than about 50μ) coating over the core/insert. Glass, metal, metal matrix composites, and carbon cores are typically preferred for some applications where elevated temperatures may be a factor, due to the reduced thermal decay of stiffness in substrates containing these materials.

The amount of filler employed is dependent upon the desired substrate mechanical properties and the fillers effects on the substrates' harmonics, surface quality, and inertial factors. The filler (particles, cavity, bubbles, core, inserts, etc.) can occupy up to as much as 99.9% or more of the volume (vol %) of the substrate, with about 5 vol % to about 50 vol % occupied by the filler more common, and about 85 vol % to about 99 vol % occupied by the filler preferred in some alternate embodiments.

Numerous methods can be employed to produce the storage media including injection molding, foaming processes, sputtering, plasma vapor deposition, vacuum deposition, electrodeposition, extrusion coating, spin coating, spray coating, meniscus coating, data stamping, embossing, surface polishing, fixturing, laminating, rotary molding, two shot molding, co-injection, over-molding of film, microcellular molding, as well as other techniques, and combinations comprising at least one of the foregoing. Preferably the technique employed enables in situ production of the substrate having the desired surface features, (e.g., servo-patterning (such as pits and grooves), bit patterning, edge features, protrusions, asperities (e.g., laser bumps, and the like), $R_a$, etc.).

One possible process comprises an injection molding-compression technique where a mold is filled with a molten plastic. The mold may contain a preform, inserts, fillers, etc. The plastic is cooled and, while still in an at least partially molten state, compressed to imprint the desired surface features (e.g., pits, grooves, edge features, smoothness, and the like), arranged in spiral concentric or other orientation, onto the desired portion(s) of the substrate, i.e. one or both sides in the desired areas. The substrate is then cooled to room temperature.

For optical or magnetic data storage on a substrate, information stored is often stored on the surface of the substrate. This information may be imprinted directly onto the surface (as in the case of a CD), or stored in a photo- or magnetically-definable medium, which has been deposited onto the surface of substrate (e.g., "Winchester" hard disk drive). Due to the surface quality requirements of such systems, disks (metal, ceramic, glass, etc.) were coated with nickel phosphide (NiP), for example, and then polished to obtain the desired surface quality. However, polishing is an expensive and laborious process. Additionally, these substrates do not traditionally offer the capability of imprinting features onto the surface, even though such features, e.g., pits or grooves, may be desirable for use as geographic locators, such as a sector map. Typically these geographic locators have a depth of up to about 30 nanometers (nm) or more, with about 20 nm to about 30 nm generally preferred.

In one embodiment, a metal, glass, ceramic, or other substrate to which a plastic layer has been applied exhibits both the desired mechanical properties and the ability to have surface features imprinted into the surface. The plastic layer can be deposited by a variety of techniques, including spin coating, vapor deposition (e.g. plasma enhanced chemical vapor deposition), electrodeposition coating, meniscus coating, spray coating, extrusion coating, and the like, and combinations comprising at least one of the foregoing.

Spin coating comprises preparing a solution of a plastic precursor (e.g., monomer or oligomer) or the plastic itself (where a solvent can be employed, or one of the monomers can act as the solvent). The disk to be coated is secured to a rotatable surface and a portion of plastic solution is dispensed near the center of the substrate. Alternately, a bead of the plastic solution is deposited in a ring like geometry, along the inner boundary of disk where the coating is to be located. The disk is then spun at a sufficient rate to, via centrifugal forces, spread the plastic solution across the surface of the disk. Finally, if applicable, the coating is dried and cured.

In order to improve adhesion of the coating to the substrate, optionally, an adhesion promoter, such as an organosilane or another conventional adhesion promoter, can be used. Possible organosilanes include VM-651 and VM-652 commercially available from DuPont. If an adhesion promoter is employed, it is typically dissolved in a solvent, such as methanol, water, and combinations comprising at least one of the foregoing, and is applied to the disk prior to applying the plastic bead. Once the adhesion promoter is spin coated onto the disk, the plastic coating is applied as described above.

For example, a polyetherimide resin, such as Ultem® resin grade 1000, commercially available from GE Plastics, is dissolved in anisole/gamma-butyrolactone solvent system (15% Ultem® resin by weight (wt %)). A rigid substrate (i.e., a hard disk) (e.g., metal, polymer, glass, or other), which is optionally polished, is placed on a rotatable device, commonly referred to as a spinner, and held in place via a mechanical device or a vacuum. An adhesion promoter, such as 5 ml of 0.05% solution VM651 (an adhesion promoter commercially available from DuPont) in water/methanol solution, is applied by dispensing it onto the spinning or stationary substrate. The substrate is then, preferably, spun to distribute the adhesion promoter, such as at a rate of about 2,000 rpm for about 30 seconds. If an adhesion promoter is employed, the substrate can optionally be rinsed, such as with methanol, to remove excess adhesion promoter, and dried (e.g., air dried, vacuum dried, heat dried, or the like), prior to the application of the plastic solution.

Once the rigid substrate has been prepared, plastic solution can be applied to the substrate around the inner diameter of the area to be coated, while optionally masking areas that are not to be coated. The substrate is spun to substantially uniformly spread the plastic solution across the substrate, forming a film. The thickness of the film is dependent upon various parameters, e.g., the quantity of plastic solution, the desired thickness, the viscosity of the plastic solution, the spin rate, the spin duration, plastic solution solids content, and environmental conditions (including temperature, humidity, atmosphere type (e.g. inert gas), and atmospheric pressure), among others. Although a thickness below about 0.1 micrometers (μ) can be attained, the film is preferably sufficiently thick to afford a planar surface over undesirable surface imperfections in the substrate and to allow desired surface features (e.g., pits, grooves, etc.) to be placed onto the film. Typically, a thickness of about 0.5μ or greater is generally preferred, with a thickness of up to about 50μ possible, up to about 20μ preferred, and about 0.5μ to about 10μ especially preferred for storage media type applications. Determination of a final thickness range will vary, in part, by the desired depth of any features to be placed onto the film as well as the surface imperfections on the rigid substrate that need to be masked by the film.

With respect to spin duration and rate, which must be sufficient to disperse the plastic solution across the substrate in the desired area, these parameters are chosen based on factors including, e.g., the plastic solution viscosity and solids content, and the desired coating thickness; all interdependent parameters. Typically, however, the spin rate is greater than about 1,000 revolutions per minute (rpm) for up to about 5 minutes or more, with greater than about 1,500 rpm for less than about 2.5 minutes preferred, and greater than about 1,800 rpm for less than about 1.5 minutes especially preferred. For example, a 3μ thick coating can be applied using plastic solution containing 15 wt % Ultem® resin grade 1000 in anisole/gamma-butyrolactone solvent, and a spin rate of 2,000 rpm for a duration of 25 seconds.

Once the coating as been dispersed across the substrate, it can be cured, preferably in an inert atmosphere, such as nitrogen, for a sufficient period of time to remove the solvent and polymerize the polymer precursor (if necessary) and at a rate effective to obtain the desired surface quality. The coated substrate can be raised to the desired temperature at a rate such that the solvent removal doesn't have deleterious effects on the surface features. For example, the coated substrate can be heated to greater than about 200° C., with about 300° C. or greater typically preferred, at a rate of up to about 10 degrees per minute (deg/min), with a rate of up to about 5 deg/min preferred, and a rate of less than about 3 deg/min especially preferred. Once the substrate has attained the desired temperature, it is maintained at that temperature for a sufficient period of time to remove the solvent and, if necessary, to polymerize the polymer precursor, and is then cooled. Typically a period of up to several hours is employed, with less than 2 hours preferred, and a rate of minutes or portions thereof especially preferred. A substrate prepared in this manner, optionally with subsequent processing, can be used for data storage applications, such as magnetic hard drives.

Alternatively, the substrate (entire substrate or coating on the core) can be cured using microwave technology. Preferably, a variable frequency microwave curing system is employed. The substrate enters the microwave area where the sweep rate, power, bandwidth, and central frequency are adjusted for the particular substrate such that the microwave selectively heats the polymer without substantially effecting the core, if desired.

Other possible curing techniques include using ultraviolet light to initiate a crosslinking reaction, radiative heating (placing the sample in close proximity to a hot surface), contact heating (sample is in physical and therefore thermal contact with a hot fixture), rapid thermal annealing (employing a heat source such as a coil or the like, or a lamp such as quartz or the like, which is heated at a very rapid rate, such as greater than 10 degrees per second), inductive heating (e.g., with radio frequency), and the like, as well as combinations comprising at least one of the foregoing.

In conjunction with the above curing techniques, other processing methods may be employed to facilitate the curing process, to remove solvent, and/or to improve the quality of the product. Possible additional processing methods include: employing a vacuum, using stripping agents (e.g., inert gasses, inert volatile solvents, azeotropes, and the like), drying agents, and other conventional methods, as well as combinations comprising at least one of the foregoing.

Alternatively, the curing time can be based upon economies and the desired surface features (pits, grooves, asperities (e.g. laser bumps), edge features, and/or smoothness) can be disposed on the surface subsequent to curing. Following application, if applicable, the plastic film is cured (thermal, ultraviolet, etc.), and, optionally, the desired surface features are formed by photolithography (including, but not limited to dry etch), laser ablation through direct write or wide exposure with the use of photomasks, hot or cold stamping, embossing, or other techniques.

Putting the surface features on the substrate by employing photolithography can be accomplished with any conventional photolithography technique, such as those which employ reactive ion etching, plasma, sputtering, and/or liquid chemicals or chemical vapors to etch the polymer coating. Conventional photolithographic techniques, e.g., nanoimprint lithography, used to prepare contact probe data storage devices are useful; however, care must be taken to retain sufficient plastic film depth within the surface feature to provide the desired planarity of the surface of the rigid substrate.

Generally, embossing is preferred since the substrate is either plastic or at least comprises a thin plastic film on the embossing surface. Not to be limited by theory, due to the rheology of the plastic material, not only can pits, grooves, and edge features be embossed into the substrate, but the desired surface quality can also be embossed (e.g., desired smoothness, roughness, microwaviness, and flatness). In a preferred embodiment, embossed bit-patterns and/or servo-patterns have a depth of about 10 nm to about 150 mn, preferably about 20 nm to about 50 nm. Depths shallower than about 10 nm can result in features that are not accurately recognized by the head device. Conversely, deeper features or features that vary outside the ranges can result in undesirable head-disk interactions.

Embossing, can be accomplished using conventional techniques. Alternatively, a unique embossing technique can be employed where a substrate, such as a disk having a plastic surface, is embossed by preheating a mold. The mold should be heated to a temperature that, in conjunction with the temperature of the substrate, is capable of embossing the desired surface features onto the plastic surface of the substrate. The mold temperature can be at, above, or below the glass transition (Tg) temperature of the material to be embossed. If the temperature is above such glass transition temperature, it is preferred the mold temperature be within about 30° C. of the glass transition temperature of the material, with a temperature within about 15° C. preferred, and a temperature within about 10° C. especially preferred; with the mold being preheated to a temperature below the glass transition temperature of the material to be embossed even more preferred. In an especially preferred embodiment, the mold is preferably heated to within a few degrees below the glass transition temperature for crystalline materials, and at a temperature within at least about 5° C., preferably within at least about 10° C. or greater for amorphous materials.

In addition to heating the mold, the substrate is heated to a temperature greater than the glass transition temperature of the material to be embossed. The substrate is heated to the material temperature required to facilitate replication of the geographic locators and/or other surface features on the substrate. Typically, the substrate is heated to about 5° C. above the glass transition temperature or less for crystalline material, with greater than about 5° C. common for amorphous materials.

Once the substrate has attained the desired temperature, it is placed in the mold and pressure is applied. After placing the substrate in the mold the temperature thereof can be maintained, increased or decreased as necessary in order to optimize replication and enable substrate release from the mold while maintaining the integrity of the surface features. Typically in order to maintain the integrity of the surface features, the molded substrate is cooled to below the glass transition temperature prior to removal from the mold.

By preheating to and maintaining the mold at a temperature below the glass transition temperature of the material, the time required for heat-up and cool-down of conventional embossing processes is significantly diminished, especially in relation to processing numerous substrates. For example, numerous substrates are heated to a temperature above the glass transition temperature of the material to be embossed. Meanwhile the mold is heated to and maintained at a temperature below the glass transition temperature. A substrate is then placed in the mold and is embossed while the mold cools the substrate (due to the temperature differential). The substrate can then be removed from the mold and the next substrate placed in the mold. It is not necessary to heat the substrate and the mold to above the glass transition temperature and then to cool the combination to below the glass transition temperature as is conventional. Conventional embossing techniques typically take about 6 to 12 hours to complete, while the above embossing techniques can be accomplished in minutes.

For example, an aluminum disk coated with polyetherimide (Ultem® resin grade 1010) is fixtured to a spindle and heated to about 780° F. (415° C.) in a furnace oven. An embossing mold having the desired surface feature negative is heated to about 205° C. Once the disk is at temperature it is loaded into the mold and, while cooling (due to the temperature of the mold) compressed under a time-pressure profile to emboss the surface features into the substrate surface. The embossed substrate is then removed from the mold.

By maintaining the mold below or slightly above the glass transition temperature and separately heating the substrate to greater than the glass transition temperature, the embossing cycle time can be reduced by orders of magnitude.

Once the substrate has been coated with polymer, and formed with the appropriate surface features, if desired various layers can then be applied to the substrate through one or more conventional techniques, e.g., sputtering, chemical vapor deposition, plasma-enhanced chemical vapor deposition, reactive sputtering, evaporation, and the like. For example, in some cases, high areal density storage media might have pits and grooves on the polymer substrate that can be solely geographic locators; i.e. they are not required to store data therein. The data is stored in data storage layer(s). Furthermore, the data stored in the data storage layer(s) may be changed (rewritten) by repeating the impinging step at higher densities than conventional, i.e. "low" density compact disks.

The layers applied to the substrate may include one or more data storage layer(s) (e.g., magnetic, magneto-optic, etc.), protective layer(s), dielectric layer(s), insulating layer(s), combinations thereof and others. The data storage layer(s) may comprise any material capable of storing retrievable data, such as an optical layer, magnetic layer, or more preferably a magneto-optic layer, having a thickness of up to about 600 Å, with a thickness up to about 300 Å preferred. Possible data storage layers include, but are not limited to, oxides (such as silicone oxide), rare earth element—transition metal alloy, nickel, cobalt, chromium, tantalum, platinum, terbium, gadolinium, iron, boron, others, and alloys and combinations comprising at least one of the foregoing, organic dye (e.g., cyanine or phthalocyanine type dyes), and inorganic phase change compounds (e.g., TeSeSn or InAgSb). Preferably, the data layer has a coercivity of at least about 1,500 oersted, with a coercivity of about 3,000 oersted or greater especially preferred.

The protective layer(s), which protect against dust, oils, and other contaminants, can have a thickness of greater than 100μ to less than about 10 Å, with a thickness of about 300 Å or less preferred in some embodiments. In another embodiment, a thickness of about 100 Å or less is especially preferred. The thickness of the protective layer(s) is usually determined, at least in part, by the type of read/write mechanism employed, e.g., magnetic, optic, or magneto-optic.

Possible protective layers include anti-corrosive materials such as nitrides (e.g., silicon nitrides and aluminum nitrides, among others), carbides (e.g., silicon carbide and others), oxides (e.g., silicon dioxide and others), polymeric materials (e.g., polyacrylates or polycarbonates), carbon film (diamond, diamond-like carbon, etc.) among others, and combinations comprising at least one of the foregoing.

The dielectric layer(s) which are often employed as heat controllers, can typically have a thickness of up to or exceeding about 1,000 Å and as low as about 200 Å. Possible dielectric layers include nitrides (e.g., silicon nitride, aluminum nitride, and others); oxides (e.g., aluminum oxide); carbides (e.g., silicon carbide); and combinations comprising at least one of the foregoing, among other materials compatible within the environment and preferably, not reactive with the surrounding layers.

The reflective layer(s) should have a sufficient thickness to reflect a sufficient amount of energy to enable data retrieval. Typically the reflective layer(s) can have a thickness of up to about 700 Å, with a thickness of about 300 Å to about 600 Å generally preferred. Possible reflective layers include any material capable of reflecting the particular energy field, including metals (e.g., aluminum, silver, gold, titanium, and alloys and mixtures comprising at least one of the foregoing, and others). In addition to the data storage layer(s), dielectric layer(s), protective layer(s) and reflective layer(s), other layers can be employed such as lubrication layer and others. Useful lubricants include fluoro compounds, especially fluoro oils and greases, and the like.

One unexpected result of the storage media described herein that contain a rigid substrate, e.g., an aluminum substrate, with a plastic resin embossed with surface features, was retention of head slap performance as compared to conventional storage media. Conventional aluminum media are typically coated, e.g., with nickel phosphide, to improve the surface hardness for polishing and to resist damage to the polished surface by contact with the head. Plastic resins are generally softer than the aluminum surface coating and would be expected to limit the head slap resistance of the storage media; however, storage media described herein containing plastic films unexpectedly exhibited no observed diminished slap resistance. This unexpected result is believed to depend somewhat on the thickness of the plastic film and plastic films having higher thickness are expected to have diminished head slap resistance. Thus, in an especially preferred embodiment, the head slap resistance of a coated aluminum substrate having a plastic film, preferably containing surface features, is substantially equivalent to the head slap resistance of the coated aluminum substrate not containing the plastic film. Similar head slap results can be obtained with other rigid substrates such as glass.

The storage media described herein can be employed in conventional optic, magneto-optic, and magnetic systems, as well as in advanced systems requiring higher quality storage media and/or areal density. During use, the storage media is disposed in relation to a read/write device such that energy (magnetic, light, a combination thereof or another) contacts the data storage layer, in the form of an energy field incident on the storage media. The energy field contacts the layer(s) disposed on the storage media prior to (if ever) contacting the substrate. The energy field causes some physical or chemical change in the storage media so as to record the incidence of the energy at that point on the layer. For example, an incident magnetic field might change the orientation of magnetic domains within the layer, or an incident light beam could cause a phase transformation where the light heats the material.

Figure 2:
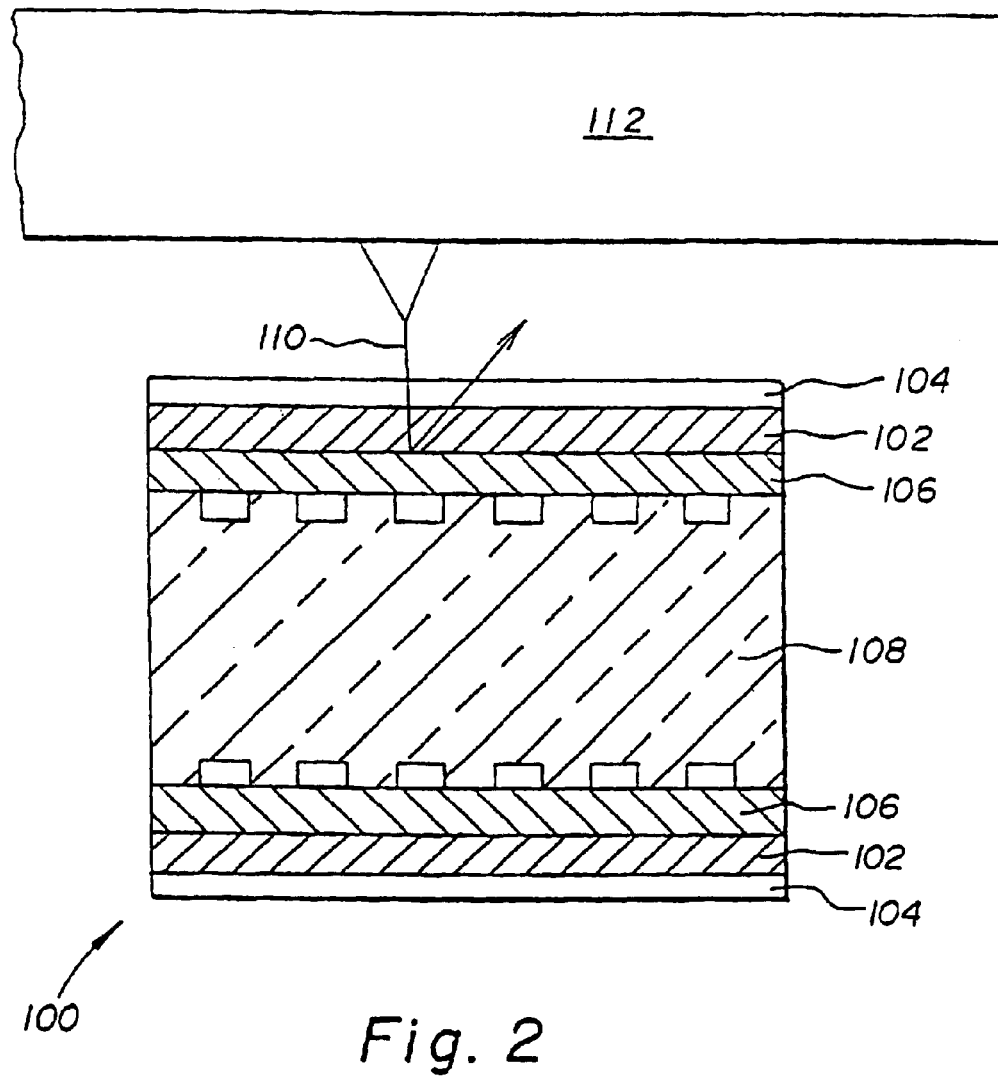
FIG. 2 is a cross-sectional illustration of a read/write system using one possible embodiment of a storage media of the present invention with a light incident on the data storage layer without passing through the substrate.

For example, referring to FIG. 2, in a magneto-optic system 100, data retrieval comprises contacting the data storage layer(s) 102 with a polarized light 110 (white light, laser light, or other) incident on such layer(s). A reflective layer 106, disposed between the data storage layer 102 and substrate 108, reflects the light back through the data storage layer 102, the protective layer 104, and to the read/write device 112 where the data is retrieved.

Figure 3:
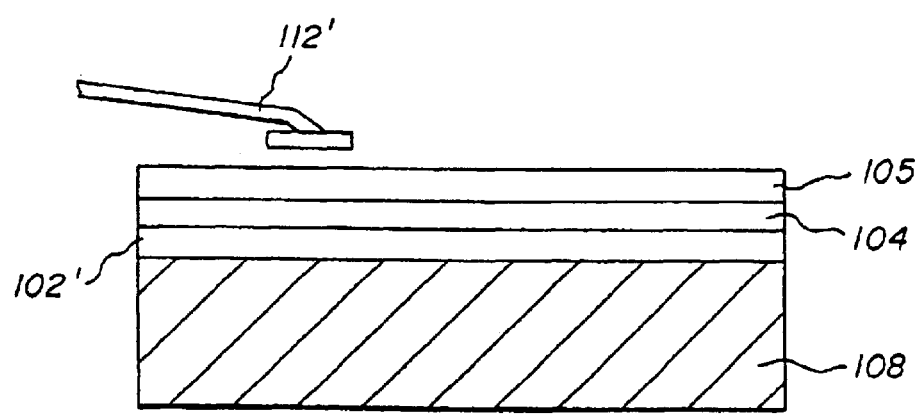
FIG. 3 is a cross-sectional illustration of one embodiment of a magnetic data storage substrate of the present invention.

In another embodiment, referring to FIG. 3, the read/write device 112 detects the polarity of magnetic domains in the disk storage layer 102' (i.e. data is read). To write data onto the storage media, a magnetic field is imposed onto the data storage layer 102' by the read/write device 112. The magnetic field passes from the read/write device 112', through the lubrication layer 105, and the protective layer 104 to the magnetic layer 102', forming magnetic domains aligned in either of two directions and thereby defining digital data bits.

The following examples are provided to further illustrate the present invention and are not intended to limit the scope thereof.

EXAMPLES

Example 1

A substrate with outer diameter of 130 mm and thickness of 1.2 mm was formed out of a polyetherimide resin (Ultem® resin grade 1010 obtained from GE Plastics) using injection molding under standard conditions known in the art. The surface smoothness of the substrate was less than 10 Å $R_a$, and the first modal frequency was about 175 Hz. At this frequency, the axial displacement was about 0.889 mm. The benefits compared to the prior art (Comparative Example #1) are clear.

Example 2

A substrate with dimensions of 130 mm diameter and 1.2 mm thickness can be produced by injection molding of polycarbonate filled with 20 wt % carbon fiber. The material will exhibit a flexural modulus of 1.6 million psi, a mechanical damping coefficient of 0.015, and specific gravity of 1.29 g/cc. The storage media will demonstrate a maximum axial displacement of 0.32 mm during vibrational excitation, and a first modal frequency of 302 Hz.

Example 3

A substrate with outer diameter of 95 mm and thickness of 2 mm was formed with a core of polyphenylene ether/polystryrene (PPE/PS) containing 20 wt % ceramic microfibers and a skin of PPE/PS (40/60) by co-injection molding. The microfibers, with average dimensions on the order of 10–20µ length×0.3–0.6µ diameter) were significantly smaller than conventional carbon fibers. The surface smoothness of the substrate was improved by approximately a factor of 2 compared to the conventional carbon fiber co-injected disk, and the first modal frequency was about 425 Hz. At this frequency, the axial displacement was about 0.15 mm. The benefits compared to the prior art (Comparative Examples #1) are clear.

Example 4

A substrate with outer diameter of 130 mm and thickness of 1.2 mm was formed with a core of 20 wt % carbon fiber-filled polycarbonate and a skin of pure polycarbonate using co-injection molding with a thickness ratio of about 1 unit of core to 1 unit of skin under standard conditions known in the art. The surface smoothness of the substrate was about 10 Å $R_a$ and the first modal frequency was about 210 Hz. At this frequency, the axial displacement was about 1.27 mm; however, the displacement and frequency can be changed with changes in the core to skin ratio. The benefits compared to the prior art (Comparative Example #1) are clear.

Example 5

A substrate with outer diameter of 120 mm and thickness of 0.9 mm is formed out of polycarbonate containing 30 wt % carbon fiber, 21 wt % poly(styrene-isoprene), and 3.5 wt % poly(styrene-maleic anhydride) (all based upon the total weight of the composition) using injection molding using standard conditions known in the art. The first modal frequency is about 292 Hz. At this frequency, the axial displacement is about 0.069 mm. The benefits compared to the prior art (Comparative Examples #1 and #2) are clear.

Example 6

A substrate with outer diameter of 95 mm and thickness of 2 mm is formed with a core of polycarbonate containing 30 wt % carbon fiber, 21 wt % poly(styrene-isoprene) vibration dampening filler, and 3.5 wt % poly(styrene-maleic anhydride) and skin of polycarbonate (all based upon the total weight of the composition) using co-injection molding under standard conditions known in the art. The core comprises about 50% of the thickness of the disk. The surface smoothness of the substrate is about 1.3 nm $R_a$ and the first modal frequency is about 450 Hz. At this frequency, the axial displacement is about 0.033 mm. The benefits compared to the prior art (Comparative Examples #1 and #2) are clear.

Example 7

A substrate with outer diameter of 130 mm and thickness of 1.2 mm is formed with a core of polycarbonate containing 20 wt % carbon fiber and 10 wt % poly(styrene-isoprene) (all based upon the total weight of the composition) and a skin of polycarbonate by injection molding the filled material in a mold that contains polycarbonate film on one or both sides of the mold. The surface smoothness of the substrate is about 1 nm $R_a$ and the first modal frequency is about 250 Hz. At this frequency, the axial displacement is about 0.20 mm. The benefits compared to the prior art (Comparative Examples #1 and #2) are clear.

Example 8

A substrate with outer diameter of 130 mm and thickness of 1.2 mm is formed with a core of polycarbonate containing 30 wt % carbon fiber in a mold that contains polycarbonate film on one or both sides of the mold. The surface smoothness of the substrate is about 1 nm $R_a$ and the first modal frequency is about 300 Hz. At this frequency, the axial displacement is about 0.40 mm. The benefits compared to the prior art (Comparative Example #1) are clear.

Example 9

A thin layer (5μ) of polyetherimide was electrochemically deposited onto one or both sides of an aluminum substrate. Subsequently, geographic locators (pits) were formed into the surface of the polyetherimide film using a hot stamping technique. This substrate was superior to a traditional aluminum substrate (Comparative Example #2) in that it contains the desirable pit structure of geographic locators and other surface features formed through embossing.

Example 10

A thin layer of polyetherimide (5μ) was deposited by spin coating a polymer containing solution onto one side of an aluminum substrate. This substrate was superior to a traditional aluminum substrate (Comparative Example #2) in that the final surface was smooth enough (less than 10 Å $R_a$ and total surface flatness less than 8μ) for use in magnetic data storage applications, but the substrate did not have to undergo the plating and polishing steps used in the preparation of conventional metal or ceramic substrates. Upon deposition of a sputtered magnetic data layer, magnetic coercivity greater than 2,500 oersted was achieved.

Example 11

A thin layer of polyetherimide (5μ) was deposited by spin coating a polymer containing solution onto one side of a glass substrate. The final surface had less than 10 Å $R_a$ and total surface flatness less than 8μ. Upon deposition of a sputtered magnetic data layer, magnetic coercivity greater than 3,000 oersted was achieved. The coated substrate showed no damage after a standard 800 G head slap test.

Example 12

A thin layer of polyetherimide can be deposited by spin coating a polymer containing solution onto one or both sides of an aluminum-boron carbide rigid substrate. This substrate would be superior to a traditional aluminum substrate (Comparative Example #2) in that the material would have a significantly higher specific modulus. It would be superior to aluminum-boron carbide substrates without a coating in that the coating makes the surface smooth enough for use in magnetic data storage applications. (Using conventional means, such as polishing, it is difficult, if not impossible, to achieve adequate surface smoothness.)

Example 13

A thin layer of polyetherimide was deposited onto one side of an aluminum substrate by spin coating a polymer-containing solution onto the surface(s) and curing. Subsequently, surface features were formed into the surface using an embossing technique, e.g., a hot stamping. This substrate was superior to a traditional aluminum substrate (Comparative Example #2) in that it contained the desirable pit structure of geographic locators and the desired surface quality; e.g., less than 10 Å $R_a$.

Example 14

A substrate with outer diameter of 130 mm and thickness of 1.2 mm and containing microporosity can be formed out of polycarbonate (Lexan® resin grade OQ1030L obtained from GE Plastics) using the Mucell microcellular injection molding process. The substrate would show 20% lower moment of inertia and higher modal frequency compared to Comparative Example #1.

Example 15

A substrate with outer diameter of 130 mm and thickness of 1.2 mm and containing a microporous and smooth polycarbonate skin can be formed out of polycarbonate (Lexan® resin grade OQ1030L obtained from GE Plastics) using the Mucell microcellular injection molding process in a mold that contains polycarbonate film on one or both sides of the mold. The substrate would demonstrate the same benefits of reduced moment of inertia and higher modal frequency of Example #13 with reduced surface roughness.

Example 16

A substrate with outer diameter of 130 mm and thickness of 1.2 mm was formed out of polyetherimide (Ultem® resin grade 1010 obtained from GE Plastics) filled with about 60 wt % of a low melting (less than 400° C.) glass filler (Corning Cortem) using injection molding under standard conditions known in the art. The first modal frequency was about 210 Hz. At this frequency, the axial displacement was about 0.723 mm. The benefits compared to the prior art (Comparative Example #1) are clear.

Example 17

A substrate with outer diameter of 120 mm and thickness of 1.2 mm was formed out of styrene-acrylonitrile copolymer (SAN CTS100 obtained from GE Plastics) using injection molding under standard conditions known in the art. The substrate showed reduced moment of inertia, improved flatness, and higher modal frequency compared to Comparative Example #1.

Example 18

A substrate with outer diameter of 120 mm and thickness of 1.2 mm was formed out of a 60/40 weight percent blend of poly(phenylene ether) resin and polystyrene using injection molding. The substrate showed reduced moment of inertia, improved flatness, and higher modal frequency compared to Comparative Example 1.

Example 19

A substrate with outer diameter of 120 mm and thickness of 1.2 mm can be formed out of a 45/30/25 weight percent blend of poly(phenylene ether) resin, polystyrene, and polystyrene-co-(acrylonitrile) using injection molding. The substrate will show reduced moment of inertia, improved flatness, and higher modal frequency compared to Comparative Example #1.

Example 20

A substrate with outer diameter of 120 mm and thickness of 1.2 mm out of a 60/40 wt % blend of poly(phenylene ether) resin with polystyrene and containing 20 wt % of zinc sulfide particulate filler (all weights based on the weight of the entire composition) using injection molding. The substrate showed reduced moment of inertia, improved flatness, and higher modal frequency compared to Comparative Example #1.

Example 21

A substrate with outer diameter of 120 mm and thickness of 1.2 mm was formed out of a 60/40 weight percent blend of poly(phenylene ether) resin with polystyrene and containing 20 wt % of clay particulate filler (all weights based on the weight of the entire composition) using injection molding. The substrate showed reduced moment of inertia, improved flatness, and higher modal frequency compared to Comparative Example #1.

Example 22

A substrate with outer diameter of 120 mm and thickness of 1.2 mm can be formed out of a 60/40 weight percent blend of poly(phenylene ether) resin with polystyrene and containing 20 wt % of zinc sulfide particulate filler (all weights based on the weight of the entire composition) using injection molding in a mold containing a "managed heat transfer" insulating layer, as described in U.S. Pat. No. 5,458,818. The substrate would show reduced moment of inertia, improved flatness, and higher modal frequency compared to Comparative Example #1 and improved replication of the mold surface compared to Example #20.

Example 23

A substrate can be prepared as in Example #15. The substrate was held using a clamping device that contained a viscoelastic washer (e.g., elastomer) between the mount and the substrate. The structure showed reduced axial displacement (0.475 mm vs. 0.723 mm) at the first modal frequency compared to the same substrate when clamped using a device not containing the elastomeric washer.

Comparative Examples

Comparative Example 1

A substrate with outer diameter of 130 mm and thickness of 1.2 mm was formed out of a polycarbonate resin (Lexan® resin grade OQ1030L obtained from GE Plastics) using injection molding. The surface smoothness of the substrate was less than about 10 Å $R_a$ and the first modal frequency was about 150 Hz. At this frequency, the axial displacement was about 1.40 mm.

Comparative Example 2

A substrate with outer diameter of 130 mm and thickness of 1.2 mm was formed out of aluminum by punching the disk from an aluminum sheet, plating with nickel-phosphide, and polishing to achieve the desired surface roughness (less than 10 Å $R_a$). The first modal frequency was about 500 Hz. At this frequency, the axial displacement was about 0.075 mm.

It should be clear from the examples and teachings provided herein that novel and/or enhanced storage media for data have been invented. In some embodiments, optical, magnetic, and/or magneto-optical media that are at least in part made from plastic and having a high storage capability, e.g., areal density greater than about 5 Gbits/in$^2$, can be designed. In other embodiments, storage media were unexpectedly provided having very desirable properties, including at least one of, e.g., surface roughness of less than about 10 Å $R_a$, low microwaviness, edge-lift less than about 8μ, mechanical damping coefficient greater than about 0.04 at a temperature of 24° C., a resonant frequency of greater than about 250 Hz, an axial displacement peak of less than about 500μ under shock or vibration excitation, a data layer with a coercivity of at least about 1,500 oersted, and a Youngs modulus of at least about 7 GPa.

Some of the storage media described herein contain a rigid core with a spin coated, spray coated, electrodeposited, or combination thereof, plastic film or layer on one or both sides. The plastic may be a thermoplastic, thermoset, or mixture thereof. In additional embodiments, the storage media has surface features (e.g., pits, grooves, edge features, asperities (e.g., laser bumps, and the like), roughness, microwaviness, and the like) placed into the plastic (film, layer, core, substrate) preferably using an embossing technique (i.e., the substrate can be physically patterned). A further advantage of a physically patterned substrate is the elimination of the need for servo-patterning (pits, grooves, etc.) of the data layer. This can eliminate the time consuming process of servo-patterning the data layer; typically a several hour process. In addition, since the data layer can be wholly or substantially free of servo-patterning, the area of the data layer available for data storage is increased.

Unexpected results were also obtained in relation to further processing and mechanical properties. As is discussed above, the plastic withstood the deposition of additional layers (e.g., data layer(s), reflective layer(s), protective layer(s), etc.) using techniques such as sputtering at elevated temperatures, often at temperatures in excess of the glass transition temperature of the plastic. Also, the hybrid storage media containing a rigid substrate having a plastic film or layer attached thereto retained head slap performance as compared to conventional storage media. These illustrative embodiments and results should be apparent to those of ordinary skill in the art from the description and examples provided herein.

Unlike prior art storage media, this storage media employs a substrate having at least a portion thereof plastic (e.g., at least a thin plastic film) to attain the desired mechanical properties and surface features. Due to the use of the plastic, in situ formation of the substrate with the desired surface features is possible. Furthermore, surface features, including roughness, etc., can be embossed directly into the substrate surface, rendering production of this storage media cost effective. A further advantage is that the surface features have a greater than about 90% replication of an original master.

What is claimed is:

1. A data storage media, comprising:
   a substrate having a first side comprising a plastic portion, a surface roughness of less than about 10 Å, and an axial displacement peak of less than about 500μ under shock and/or vibration excitation when excited by a 1 G sinusoidal loading, wherein said plastic portion has a thickness of less than about 50μ;
   an additional layer having a thickness of less than about 1,000 Å. wherein said additional layer is disposed in physical contact with said plastic portion; and
   magnetic data layer on said additional layer, wherein said magnetic data layer has a coercivity of greater than about 1,500 ocrsted;

wherein said data layer can be at least partly read from, written to, or a combination thereof by an energy field; and wherein, when the energy field contacts said data storage media the energy field is incident upon said data layer before it could be incident upon said substrate.

2. The data storage media as in claim 1, wherein said surface roughness is less than about 5 Å.

3. The data storage media as in claim 1, wherein said substrate further comprises a mechanical damping coefficient of greater than about 0.04 at a temperature of 24° C.

4. The data storage media as in claim 3, wherein said mechanical damping coefficient is neater than about 0.06 at a temperature of 24° C.

5. The data storage media as in claim 1, wherein said substrate further comprises a radial tilt and tangential tilt independently of less than about 1° each, when measured in a resting state.

6. The data storage media as in claim 1, wherein said substrate further comprises a first modal frequency greater than an operating frequency.

7. The data storage media as in claim 1, wherein said substrate further comprises a core having a varied thickness.

8. The data storage media as in claim 1, wherein said substrate consists essentially of plastic.

9. The data storage media as in claim 8, wherein said plastic comprises a resin selected from the group consisting of polyvinyl chloride, polyolefins, polyesters, polyimide, polyamides, polysulfones, polyether imides, polyether sulfones, polyphenylene sulfides, polyether ketones, polyether ether ketones, ABS resins, polybutadiene, polyacrylates, polyacrylonitrile, polyacetals, ethylene-vinyl acetate copolymers, polyvinyl acetate, liquid crystal polymers, aromatic polyesters, polyvinyl fluoride, polyvinylidene fluoride, polyvinylidene chloride, and blends, copolymers, mixtures, reaction products, and composites comprising at least one of the foregoing resins.

10. The data storage media as in claim 1, wherein said coercivity is greater than about 2,500 oersted.

11. The data storage media as in claim 10, wherein said coercivity is greater than about 3,000 oersted.

12. The data storage media as in claim 1, wherein the substrate further comprises another plastic portion disposed on a second side of said substrate opposite said first side.

13. The data storage media as in claim 12, further comprising another data layer disposed on said second side.

14. The data storage media as in claim 13, further comprising another additional layer disposed between said another plastic portion and said another data layer.

15. The data storage media as in claim 1, wherein said substrate further comprises an edge-lift height of less than about 8μ.

16. The data storage media as in claim 15, wherein said edge-lift height is less than about 5μ.

17. The data storage media as in claim 16, wherein said edge-lift height is less than about 3μ.

18. The data storage media as in claim 1, wherein said plastic portion comprises a resin selected from the group consisting or polystyrene, polyphenylene ethers, ethylene-tetrafluoroethylene copolymer, tetrafluoroethylene fluorocarbon polymer, and blends, copolymers, mixtures, reaction products, and composites comprising at least one of the foregoing resins.

19. The data storage media as in claim 1, wherein said plastic portion comprises a resin selected from the group consisting of polycarbonate, and blends, copolymers, mixtures, reaction products, and composites comprising polycarbonate.

20. The data storage media as in claim 1, wherein said plastic portion comprises a physical pattern.

21. The data storage media as in claim 1, wherein said substrate further comprises metal.

22. The data storage media as in claim 1, wherein said substrate is selected from the group consisting of metal, glass, ceramic, and combinations comprising at least one of the foregoing substrates, wherein the plastic portion comprises a physical pattern, wherein said plastic film has a film thickness of less than about 20μ; and wherein said substrate has a substrate thickness of about 0.8 mm to about 1.2 mm.

23. The data storage media as in claim 22, wherein said substrate is metal.

24. The data storage media as in claim 22, wherein said film thickness is about 0.5μ to about 10μ.

25. The data storage media as in claim 22, wherein said physical pattern has a depth of about 20 nm to about 30 nm.

26. The data storage media as in claim 22, wherein said substrate is glass.

27. A data storage media, comprising:

a substrate having a first side comprising a plastic portion, a surface roughness of less than about 10 Å, and an axial displacement peak of less than about 500μ under shock and/or vibration excitation when excited by a 1 G sinusoidal loading, wherein said plastic portion has a thickness of less than about 50μ; and a magnetic data layer on said substrate, wherein said data layer is in physical contact with said plastic portion, wherein said magnetic data layer has a coercivity of greater than about 1,500 oersted;

wherein said data layer can be at least partly read from, written to, or a combination thereof by an energy field; and wherein, when the energy field contacts said data storage media the energy field is incident upon said data layer before it could be incident upon said substrate.

28. The data storage media as in claim 27, wherein said substrate further comprises an edge-lift height of less than about 8μ.

29. The data storage media as in claim 28, wherein said edge-lift height is less than about 5μ.

30. The data storage media as in claim 29, wherein said edge-lift height is less than about 3μ.

31. The data storage media as in claim 27, wherein said surface roughness is less than about 5 Å.

32. The data storage media as in claim 27, wherein said substrate further comprises a mechanical damping coefficient of greater than about 0.04 at a temperature of 24° C.

33. The data storage media as in claim 27, wherein said mechanical damping coefficient is greater than about 0.06 at a temperature of 24° C.

34. The data storage media as in claim 27, wherein said substrate further comprises a radial tilt and tangential tilt independently of less than about 1° each, when measured in a resting state.

35. The data storage media as in claim 27, wherein said substrate further comprises a first modal frequency greater than an operating frequency.

36. The data storage media as in claim 27, wherein said substrate further comprises a core having a varied thickness.

37. The data storage media as in claim 27, wherein said substrate consists essentially of plastic.

38. The data storage media as in claim 37, wherein said plastic comprises a resin selected from the group consisting of polyvinyl chloride, polyolefins, polyesters, polyimide, polyamides, polysulfones, polyether imides, polyether sulfones, polyphenylene sulfides, polyether ketones, polyether ether ketones, ABS resins, polybutadiene, polyacrylates, polyacrylonitrile, polyacetals, ethylene-vinyl acetate copolymers, polyvinyl acetate, liquid crystal polymers, aromatic polyesters, polyvinyl fluoride, polyvinylidene fluoride, polyvinylidene chloride, and blends, copolymers, mixtures, reaction products, and composites comprising at least one of the foregoing resins.

39. The data storage media as in claim 27, wherein said coercivity is greater than about 2,500 oersted.

40. The data storage media as in claim 39, wherein said coercivity is greater than about 3,000 oersted.

41. The data storage media as in claim 27, wherein the substrate further comprises another plastic portion disposed on a second side of said substrate opposite said first side.

42. The data storage media as in claim 41, further comprising another data layer disposed on said second side.

43. The data storage media as in claim 42, further comprising another additional layer disposed between said another plastic portion and said another data layer.

44. The data storage media as in claim 27, wherein said plastic portion comprises a resin selected from the group consisting of polystyrenes, polyphenylene ethers, ethylene-tetrafluoroethylene copolymer, tetrafluoroethylene fluorocarbon polymer, and blends, copolymers mixtures, reaction products, and composites comprising at least one of the foregoing resins.

45. The data storage media as in claim 27, wherein said plastic portion comprises a resin selected from the group consisting of polycarbonate, and blends, copolymers, mixtures, reaction products, and composites comprising polycarbonate.

46. The data storage media as in claim 27, wherein said plastic portion comprises a physical pattern.

47. The data storage media as in claim 27, wherein said substrate further comprises metal.

48. The data storage media as in claim 27, wherein said substrate is selected from the group consisting of metal, glass, ceramic, and combinations comprising at least one of the foregoing substrates,
    wherein the plastic portion comprises a physical pattern,
    wherein said plastic film has a film thickness of less than about 20µ; and
    wherein said substrate has a substrate thickness of about 0.8 mm to about 1.2 mm.

49. The data storage media as in claim 48, wherein said substrate is metal.

50. The data storage media as in claim 48, wherein said film thickness is about 0.5µ to about 10µ.

51. The data storage media as in claim 48, wherein said physical pattern has a depth of about 20 nm to about 30 nm.

52. The data storage media as in claim 48, wherein said substrate is glass.

53. A method for retrieving data, comprising:
    rotating a storage media comprising a magnetic data layer and a substrate, wherein said magnetic data layer is in physical contact with the plastic portion, wherein said magnetic data layer has a coercivity of greater than about 1,500 oersted, wherein said substrate has a first side comprising a plastic portion, has a surface roughness of less than about 10 Å, and has an axial displacement peak of less than about 500µ under shock and/or vibration excitation when excited by a 1 G sinusoidal loading, and wherein said plastic portion has a thickness of less than about 50µ;
    directing an energy field at said storage media such that said energy field is incident upon the data layer before it can be incident upon the substrate; and
    retrieving information from the data layer via said energy field.

54. The method for retrieving data as in claim 53, wherein rotating said storage media comprises rotating said storage media at a variable speed.

55. The method for retrieving data as in claim 53, wherein said edge-lift height is less than about 5µ.

56. The method for retrieving data as in claim 53, wherein said mechanical damping coefficient is greater than about 0.06 at a temperature of 24° C.

57. The method for retrieving data as in claim 53, wherein said substrate further comprises a radial tilt and tangential tilt independently of less than about 1° each, when measured in a resting state.

58. The method for retrieving data as in claim 53, wherein said substrate further comprises a first modal frequency greater than an operating frequency.

59. The method for retrieving data as in claim 53, wherein said substrate consists essentially of plastic.

60. The method for retrieving data as in claim 59, wherein said plastic comprises a resin selected from the group consisting of polyvinyl chloride, polyolefins, polyesters, polyimide, polyamides, polysulfones, polyether imides, polyether sulfones, polyphenylene sulfides, polyether ketones, polyether ether ketones, ABS resins, polybutadiene, polyacrylates, polyacrylonitrile, polyacetals, ethylene-vinyl acetate copolymers, polyvinyl acetate, liquid crystal polymers, aromatic polyesters, polyvinyl fluoride, polyvinylidene chloride, polyvinylidene chloride, and blends, copolymers, mixtures, reaction products, and composites comprising at least one of the foregoing resins.

61. The method for retrieving data as in claim 53, wherein said coercivity is greater than about 3,000 oersted.

62. The method for retrieving data as in claim 53, wherein said plastic portion comprises a resin selected from the group consisting of polystyrenes, polyphenylene ethers, ethylene-tetrafluoroethylene copolymer, tetrafluoroethylene fluorocarbon polymer, and blends, copolymers, mixtures, reaction products, and composites comprising at least one of the foregoing resins.

63. The method for retrieving data as in claim 53, wherein said plastic portion comprises a resin selected from the group consisting of polycarbonate, and blends, copolymers, mixtures, reaction products, and composites comprising polycarbonate.

64. The method for retrieving data as in claim 53, wherein said plastic portion comprises a physical pattern.

65. The method for retrieving data as in claim 53, wherein said substrate further comprises metal.

66. A method for retrieving data, comprising:
    rotating a storage media comprising a magnetic data layer, an additional layer having a thickness of less than about 1,000 Å, and a substrate having a first side comprising a plastic portion, wherein said addition layer is in physical contact with the plastic portion, wherein said magnetic data layer has a coercivity of greater than about 1,500 oersted, wherein said substrate has a surface roughness of less than about 10 Å and an axial displacement peak of less than about 500µ under shock and/or vibration excitation when excited by a 1 G sinusoidal loading, and wherein said plastic portion has a thickness of less than about 50µ;
    directing an energy field at said storage media such that said energy field is incident upon the data layer before it can be incident upon the substrate; and retrieving information from the data layer via said energy field.

67. The method for retrieving data as in claim 66, wherein rotating said storage media comprises rotating said storage media at a variable speed.

68. The method for retrieving data as in claim 66, wherein said edge-lift height is less than about 5μ.

69. The method for retrieving data as in claim 66, wherein said mechanical damping coefficient is greater than about 0.06 at a temperature of 24° C.

70. The method for retrieving data as in claim 66, wherein said substrate further comprises a radial tilt and tangential tilt independently of less than about 1° each, when measured in a resting state.

71. The method for retrieving data as in claim 66, wherein said substrate further comprises a first modal frequency greater than an operating frequency.

72. The method for retrieving data as in claim 66, wherein said substrate consists essentially of plastic.

73. The method for retrieving data as in claim 72, wherein said plastic comprises a resin selected from the group consisting of polyvinyl chloride, polyolefins, polyesters, polyimide, polyamides, polysulfones, polyether imides, polyether sulfones, polyphenylene sulfides, polyether ketones, polyether ether ketones, ABS resins, polybutadiene, polyacrylates, polyacrylonitrile, polyacetals, ethylene-vinyl acetate copolymers, polyvinyl acetate, liquid crystal polymers, aromatic polyesters, polyvinyl fluoride, polyvinylidene fluoride, polyvinylidene chloride, and blends, copolymers, mixtures, reaction products, and composites comprising at least one of the foregoing resins.

74. The method for retrieving data as in claim 66, wherein said coercivity is greater than about 3,000 oersted.

75. The method for retrieving data as in claim 66, wherein said plastic portion comprises a resin selected from the group consisting of polystyrenes, polyphenylene ethers, ethylene-tetrafluoroethylene copolymer, tetrafluoroethylene fluorocarbon polymer, and blends, copolymers, mixtures, reaction products, and composites comprising at least one of the foregoing resins.

76. The method for retrieving data as in claim 66, wherein said plastic portion comprises a resin selected from the group consisting of polycarbonate, and blends, copolymers, mixtures, reaction products, and composites comprising polycarbonate.

77. The method for retrieving data as in claim 66, wherein said plastic portion comprises a physical pattern.

78. The method for retrieving data as in claim 66, wherein said substrate further comprises metal.

79. A hard disk storage media for data, said media comprising:
   a hard disk substrate having a surface roughness of less than about 10 Å, wherein the substrate has a thickness of less than about 1.2 mm;
   a plastic film, wherein said plastic film has a film thickness of less than about 50μ; and
   a magnetic data layer disposed on said plastic film, wherein said data layer has a coercivity of greater than about 1,500 oersted;
   wherein said magnetic data layer can be at least partly read from, written to, or a combination thereof by a magnetic field; and
   wherein the storage media has a tilt of less than about 1°, measured in a resting state, wherein said tilt is selected from the group consisting of radial tilt and tangential tilt, wherein one of the following conditions are met: (i) said data layer is in physical contact with said plastic film, or (ii) an additional layer having a thickness of less than about 1000 Å is located between said data layer and said plastic film and said additional layer is in physical contact with said plastic film.

80. The storage media as in claim 79, wherein said substrate has a Young's modulus of greater than about 70 GPa.

81. The storage media as in claim 80, wherein said Young's modulus is greater than about 200 GPa.

82. The storage media as in claim 79, wherein said substrate is selected from the group consisting of glass, ceramic, and combinations comprising at least one of the foregoing.

83. The storage media as in claim 79, wherein said coercivity is at least about 3,000 oersted.

84. The storage media as in claim 79, wherein said plastic film comprises a thermoplastic resin of the group consisting of polyetherimides, polyetheretherketones, polysulfones, polyethersulfones, polyethcrethersulfones, polystyrenes, polyphenylene cthers, thermoplastic polyimides, and blends, copolymers, mixtures, reaction products, and composites comprising at least one of the foregoing resins.

85. The storage media as in claim 79, wherein said plastic film comprises polycarbonate.

86. The storage media as in claim 79, wherein said plastic film comprises a thermoset resin selected from the group consisting of epoxy, phenolic, alkyds, polyester, polyimide, polyurethane, mineral filled silicone, bis-maleimides, cyanate esters, vinyl, and beazocyclobutene resins, and blends, copolymers, mixtures, reaction products, and composites comprising at least one of the foregoing resins.

87. The storage media as in claim 79, wherein said plastic film has a film thickness of less than about 20μ.

88. The storage media as in claim 87, wherein said film thickness is about 0.5μ to about 10μ.

89. The storage media as in claim 79, wherein said substrate has a substrate thickness of about 0.8 mm to about 1.2 mm.

90. The storage media as in claim 79, wherein said substrate is metal.

91. The storage media as in claim 79, wherein said plastic portion comprises a physical pattern.

92. The storage media as in claim 91, wherein said physical pattern has a depth of about 20 nm to about 30 nm.

93. The storage media of claim 1, wherein the plastic portion further comprises a material selected from the group consisting of microfibers, fibrils, nanotubes, and whiskers.

94. The storage media of claim 1, wherein the material comprises a material selected from the group consisting of metal and carbon.

95. The storage media of claim 94, wherein the material comprises a form selected from the group consisting of microfibers, fibrils, nanotubes, and whiskers.

96. The storage media of claim 94, wherein the material comprises a form selected from the group consisting of particles, bubbles, microspheres, hollow fillers, fibers, and mesh.

97. The storage media of claim 1, wherein the plastic portion is a composite.

98. The storage media of claim 27, wherein the plastic portion further comprises a material selected from the group consisting of microfibers, fibrils, nanotubes, and whiskers.

99. The storage media of claim 27, wherein the plastic portion further comprises a material selected from the group consisting of metal and carbon.

100. The storage media of claim 99, wherein the material comprises a form selected from the group consisting of microfibers, fibrils, nanotubes, and whiskers.

101. The storage media of claim 99, wherein the material comprises a form selected from the group consisting of particles, bubbles, microspheres, hollow fillers, fibers, and mesh.

102. The storage media of claim 27, wherein the plastic portion is a composite.

103. The storage media of claim 79, wherein the plastic film is a composite.

104. The storage media of claim 79, wherein the plastic film further comprises a material selected from the group consisting of microfibers, fibrils, nanotubes, and whiskers.

105. The storage media of claim 79, wherein the plastic film further comprises a material selected from the group consisting of metal and carbon.

106. The storage media of claim 105, wherein the material comprises a form selected from the group consisting of microfibers, fibrils, nanotubes, and whiskers.

107. The storage media of claim 105, wherein the material comprises a form selected from the group consisting of particles, bubbles, microsphers, hollow fillers, fibers, and mesh.

* * * * *